(12) United States Patent
Lee et al.

(10) Patent No.: US 12,713,895 B2
(45) Date of Patent: Aug. 18, 2026

(54) SEMICONDUCTOR PACKAGE AND METHOD FOR MANUFACTURING THE SAME

(71) Applicant: Samsung Electronics Co., Ltd., Suwon-si (KR)

(72) Inventors: Jihyun Lee, Suwon-si (KR); Junho Lee, Suwon-si (KR)

(73) Assignee: Samsung Electronics Co, Ltd., Gyeonggi-do (KR)

( * ) Notice: Subject to any disclaimer, the term of this patent is extended or adjusted under 35 U.S.C. 154(b) by 269 days.

(21) Appl. No.: 18/592,908

(22) Filed: Mar. 1, 2024

(65) Prior Publication Data

US 2024/0379604 A1 Nov. 14, 2024

(30) Foreign Application Priority Data

May 12, 2023 (KR) ........................ 10-2023-0061929
Aug. 22, 2023 (KR) ........................ 10-2023-0110018

(51) Int. Cl.
*H01L 23/00* (2006.01)
*H10W 20/42* (2026.01)
*H10W 72/00* (2026.01)
*H10W 72/20* (2026.01)
*H10W 90/00* (2026.01)

(52) U.S. Cl.
CPC ...... *H10W 20/42* (2026.01); *H10W 72/01208* (2026.01); *H10W 72/252* (2026.01); *H10W 72/283* (2026.01); *H10W 90/722* (2026.01)

(58) Field of Classification Search
CPC ........... H10W 20/42; H10W 72/01208; H10W 72/072; H10W 72/252; H10W 72/283; H10W 72/90; H10W 90/722
See application file for complete search history.

(56) References Cited

U.S. PATENT DOCUMENTS 5,889,655 A 3/1999 Barrow
8,232,642 B2 7/2012 Kim et al.
(Continued)

FOREIGN PATENT DOCUMENTS

JP 2013/004919 A 1/2013
JP 2017/022149 A 1/2017
KR 2014/0068653 A 6/2014

*Primary Examiner* — Jaehwan Oh
(74) *Attorney, Agent, or Firm* — HARNESS, DICKEY & PIERCE, P.L.C.

(57) ABSTRACT

A semiconductor structure may include an insulation layer surrounding side surfaces of vias, connection pads on the vias, respectively, a first insulation member on the insulation layer and including through openings in which the connection pads respectively are disposed, and a second insulation member on the insulation layer and surrounding the first insulation member. Each corresponding connection pad among the plurality of connection pads may be on a corresponding via among the plurality of vias and in a corresponding through opening among the plurality of through openings. A height of the second insulation member may be lower than the heights of the connection pads. Outermost through openings among the through openings may include a first inner side surface defined by a side surface of the first insulation member and a second inner side surface defined by a side surface of the second insulation member.

20 Claims, 45 Drawing Sheets

(56) References Cited

U.S. PATENT DOCUMENTS

| | | | | |
|---|---|---|---|---|
| 8,853,866 | B2 | 10/2014 | Fujisawa | |
| 8,921,221 | B2 | 12/2014 | McLeod et al. | |
| 9,148,958 | B2 | 9/2015 | Hiroshima et al. | |
| 9,312,237 | B2 | 4/2016 | Zheng et al. | |
| 10,535,590 | B2 | 1/2020 | Rosch | |
| 11,315,897 | B2 | 4/2022 | Takaku | |
| 2008/0185711 | A1* | 8/2008 | Hsu | H05K 3/243 257/701 |
| 2011/0108982 | A1 | 5/2011 | Kim et al. | |
| 2012/0299183 | A1 | 11/2012 | Fujisawa | |
| 2012/0318855 | A1 | 12/2012 | McLeod et al. | |
| 2015/0053456 | A1 | 2/2015 | Lee et al. | |
| 2015/0108204 | A1 | 4/2015 | Zheng et al. | |
| 2015/0116962 | A1 | 4/2015 | Hiroshima et al. | |
| 2015/0131254 | A1 | 5/2015 | Kim et al. | |
| 2015/0357277 | A1 | 12/2015 | Nagai et al. | |
| 2016/0049379 | A1* | 2/2016 | Song | H10W 70/65 257/737 |
| 2018/0061793 | A1 | 3/2018 | Cheng | |
| 2019/0206774 | A1 | 7/2019 | Rosch | |
| 2021/0296273 | A1 | 9/2021 | Takaku | |

* cited by examiner

110

215P 119A

117

210

116 114 115

120

120

SEMICONDUCTOR PACKAGE AND METHOD FOR MANUFACTURING THE SAME

CROSS-REFERENCE TO RELATED APPLICATION

This application claims priority to and the benefit of Korean Patent Application No. 10-2023-0061929 filed in the Korean Intellectual Property Office on May 12, 2023, and Korean Patent Application No. 10-2023-0110018 filed in the Korean Intellectual Property Office on Aug. 22, 2023, the entire contents of each of which are incorporated herein by reference.

BACKGROUND

(a) Field

The present disclosure relates to a semiconductor package and/or a method for manufacturing the same.

(b) Description of the Related Art

A surface mount technology (SMT) is a technology for attaching a semiconductor die to a connection pattern formed on a surface of a printed circuit board (PCB). When performing the surface mount technology (SMT), solder may be used as an intermediate medium to electrically connect a connection pattern on a semiconductor die and a printed circuit board (PCB). In addition, a solder resist may be disposed on the surface of the printed circuit board (PCB) to limit and/or prevent a short circuit between solder members and between solder members and connection patterns. Solder resist may be used to protect circuits.

The solder resist may have a solder resist opening (SRO), which may be a through opening, at a position where the solder and the connection pattern of the printed circuit board (PCB) are bonded. In general, the solder resist opening may have a circular shape. If, during the reflow process in which the solder is bonded, warpage occurs in the semiconductor package and the solder collapses, the solder members may extend in a circular direction along the shape of the solder resist opening and come into contact with each other, resulting in a short circuit between the solder members. Since warpage may occur more at the corner than at the center of the semiconductor package, the above-described circularly expanded solder members contacting each other may appear mainly on the corner of the printed circuit board (PCB) when the printed circuit board (PCB) and the semiconductor die are attached.

Therefore, it may be necessary to develop a new semiconductor package technology capable of limiting and/or preventing a short circuit between solder members disposed in the corner portion of a printed circuit board (PCB) when surface mount technology (SMT) is performed.

SUMMARY

The present disclosure relates to a semiconductor package and/or a method for manufacturing a semiconductor package to limit and/or prevent a short circuit between solder members disposed on the corner of a printed circuit board (PCB) when performing the surface mount technology (SMT).

The present disclosure relates to a semiconductor package and/or a method for manufacturing a semiconductor package, in which an insulation member surrounding first connection pads may be disposed below the outermost solder balls and may be configured as a first insulation member and a second insulation member, a height of the first insulation member may be higher than a height of the first connection pad, and a height of the second insulation member may be lower than a height of the first connection pad.

The present disclosure relates to a semiconductor package and/or a method for manufacturing a semiconductor package that may include a third insulation member surrounding second connection pads disposed on the outermost solder balls and a fourth insulation member surrounding the third insulation member, where a height of the third insulation member may be higher than a height of the second connection pad, and a height of the fourth insulation member may be lower than a height of the second connection pad.

According to an embodiment, a semiconductor structure may include a plurality of vias; an insulation layer surrounding side surfaces of the plurality of vias; a plurality of connection pads on the plurality of vias, respectively; a first insulation member on the insulation layer, the first insulating member including a plurality of through openings in which the plurality of connection pads respectively are disposed, such that each corresponding connection pad among the plurality of connection pads is on a corresponding via among the plurality of vias and in a corresponding through opening among the plurality of through openings, and a height of the first insulation member may be higher than heights of the plurality of connection pads; and a second insulation member on the insulation layer and surrounding the first insulation member. A height of the second insulation member may be lower than the heights of the plurality of connection pads, and outermost through openings among the plurality of through openings may include a first inner side surface defined by a side surface of the first insulation member and a second inner side surface defined by a side surface of the second insulation member.

According to an embodiment, a semiconductor structure may include a first structure, a second structure on the first structure, and a plurality of connection members between the first structure and the second structure. The first structure may include a plurality of first vias, a first insulation layer surrounding side surfaces of the plurality of first vias, a plurality of first connection pads on the plurality of first vias, a first insulating member on the first insulation layer, and a second insulation member on the first insulation layer and surrounding the first insulation layer. The first insulation member may include a plurality of through openings in which the plurality the plurality of first connection pads may be disposed, such that each corresponding first connection pad among the plurality of first connection pads may be on a corresponding first via among the plurality of first vias and may be in a corresponding through opening among the plurality of through openings. A height of the first insulation member may be higher than heights of the plurality of first connection pads. A height of the second insulation member may be lower than the heights of the plurality of first connection pads. Outermost through openings among the plurality of through openings may include a first inner side surface defined by a side surface of the first insulation member and a second inner side surface defined by a side surface of the second insulation member. The second structure may include a plurality of second connection pads, a third insulation member surrounding the plurality of second connection pads, a plurality of second vias on the plurality of second connection pads, and a second insulation layer surrounding the plurality of second vias. Each corresponding second via among the plurality of second vias may be on a corresponding second connection pad among the plurality of second connection pads.

According to an embodiment, a method for manufacturing a semiconductor structure may include forming a plurality of connection pads on a substrate base, the substrate base including a plurality of vias and an insulation layer surrounding side surfaces of the plurality of vias; applying a first solder resist on the substrate base and the plurality of connection pads; forming a plurality of first through openings in the first solder resist such that the plurality of connection pads are exposed; applying a second solder resist in the plurality of first through openings and on the first solder resist; and removing the second solder resist of an edge region of the substrate base, such that the first solder resist of the edge region of the substrate base is exposed, while forming a plurality of second through openings in the second solder resist such that the plurality of connection pads are exposed. A height of the first solder resist may be lower than a height of the plurality of connection pads, and a sum of the height of the first solder resist and a height of the second solder resist may be larger than heights of the plurality of connection pads.

A semiconductor package according to an embodiment may include, a first structure, where the first structure includes a first die base, a plurality of first connection pads on an upper surface of the first die base, and a first insulation member disposed on the upper surface of the first die base and configured to surround side surfaces of the plurality of first connection pads, a second structure on the first structure, wherein the second structure includes a second die base, a plurality of second connection pads on a bottom surface of the second die base, a third insulation member disposed on the bottom surface of the second die base and configured to surround side surfaces of the plurality of second connection pads where a height of the third insulation member is higher than a height of each second connection pad of the plurality of second connection pads, and a fourth insulation member disposed on a bottom surface of the die base and configured to surround the third insulation member where the height of each second connection pad is higher than a height of the fourth insulation member, and a plurality of connection members between the first structure and the second structure.

If, during the reflow process in which the solder and the connection pattern of the printed circuit board (PCB) are bonded, warpage occurs in the semiconductor package and the solder collapses, the solders circularly extending along the circular shape of the solder resist opening come into contact with each other, resulting in a short circuit between the solders.

In order to limit and/or prevent this, a semiconductor package according to an embodiment may include a first insulation member surrounding first connection pads disposed under outermost solder balls, and a second insulation member surrounding the first insulation member. A height of the first insulation member may be higher than a height of the first connection pad, and a height of the second insulation member may be lower than a height of the first connection pad.

Accordingly, the first insulation member having higher height may serve as a barrier wall limiting and/or preventing the solder paste from flowing toward other solders, and the second insulation member having a lower height may serve to guide the solder paste to a direction where there is no other solders.

In addition, a semiconductor package according to an embodiment may include a third insulation member surrounding the second connection pads disposed on the outermost solder balls, and a fourth insulation member surrounding the third insulation member. A height of the third insulation member may be higher than a height of the second connection pad, and a height of the fourth insulation member may be lower than a height of the second connection pad.

Accordingly, the third insulation member having higher height may serve as a barrier wall limiting and/or preventing the solder paste from flowing toward other solders, and the fourth insulation member having a lower height may serve to guide the solder paste to a direction where there is no other solders.

Therefore, even if warpage occurs in the semiconductor package during the reflow process, occurrence of a short circuit between solders may be limited and/or prevented.

DETAILED DESCRIPTION

Figure 1:
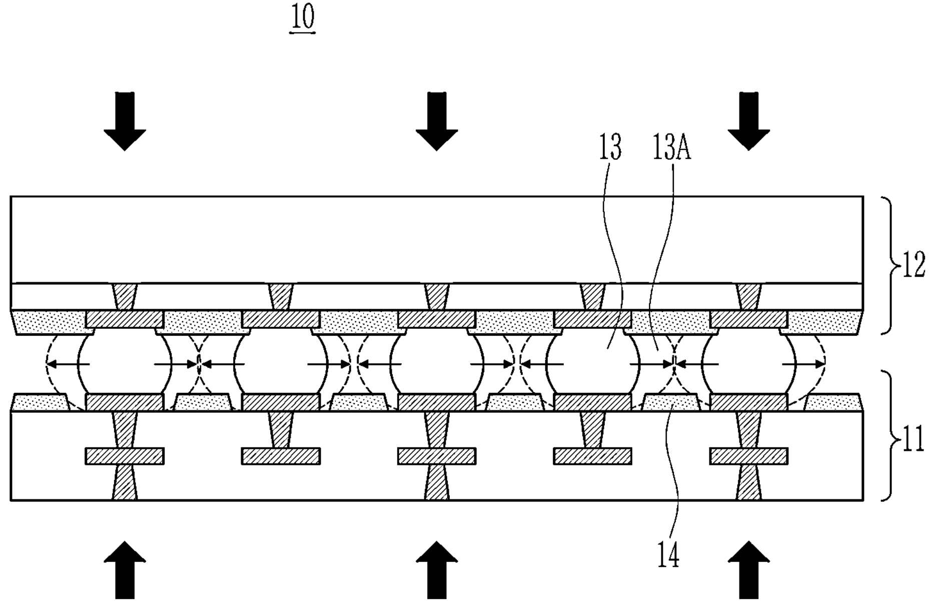
FIG. 1 is a cross-sectional view showing that the printed circuit board (PCB) and semiconductor die are bonded by connection member in the conventional semiconductor package.

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure.

The drawings and description are to be regarded as illustrative in nature and not restrictive. Like reference numerals designate like elements throughout the specification.

Further, in the drawings, the size and thickness of each element are arbitrarily illustrated for ease of description, and the present disclosure is not necessarily limited to those illustrated in the drawings.

Throughout this specification and the claims that follow, when it is described that an element is "coupled or connected" to another element, the element may be "directly coupled or connected" to the other element or "indirectly coupled or connected" to the other element through a third element. In addition, unless explicitly described to the contrary, the word "comprise" and variations such as "comprises" or "comprising" will be understood to imply the inclusion of stated elements but not the exclusion of any other elements.

It will be understood that when an element such as a layer, film, region, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

FIG. 1 is a cross-sectional view showing that a printed circuit board 11 and a semiconductor die 12 are bonded by a connection member 13 in a conventional the semiconductor package 10.

Referring to FIG. 1, in order to mount the semiconductor die 12 on the printed circuit board 11, solder members 13 may be dispose between the printed circuit board 11 and the semiconductor die 12. In addition, in order to limit and/or prevent a short circuit between the solder members 13 and to protect circuit patterns formed in the printed circuit board 11, the printed circuit board 11 may include a solder resist 14 on its surface.

When warpage occurs in the semiconductor package 10 or another process problem occurs during performing the surface mount technology (SMT) that attaches the printed circuit board 11 and the semiconductor die 12, solder pastes before curing to the solder members 13 may be collapsed. At this time, the shape of the collapsed solder paste may have an elliptical shape extending along the circular shape of the solder resist opening. When the solder pastes 13A expanded in an elliptical shape are cured while being in contact with each other, a short circuit may occur between the solder members 13A and a solder bridge defect may occur.

Considering that warpage is more possible in the corner portion of the semiconductor package than the center portion, the above-described solder bridge defect may appear mainly on the corner portion of the printed circuit board (PCB).

Hereinafter, a semiconductor package 100 according to an embodiment is described with reference to the drawing.

Figure 2:
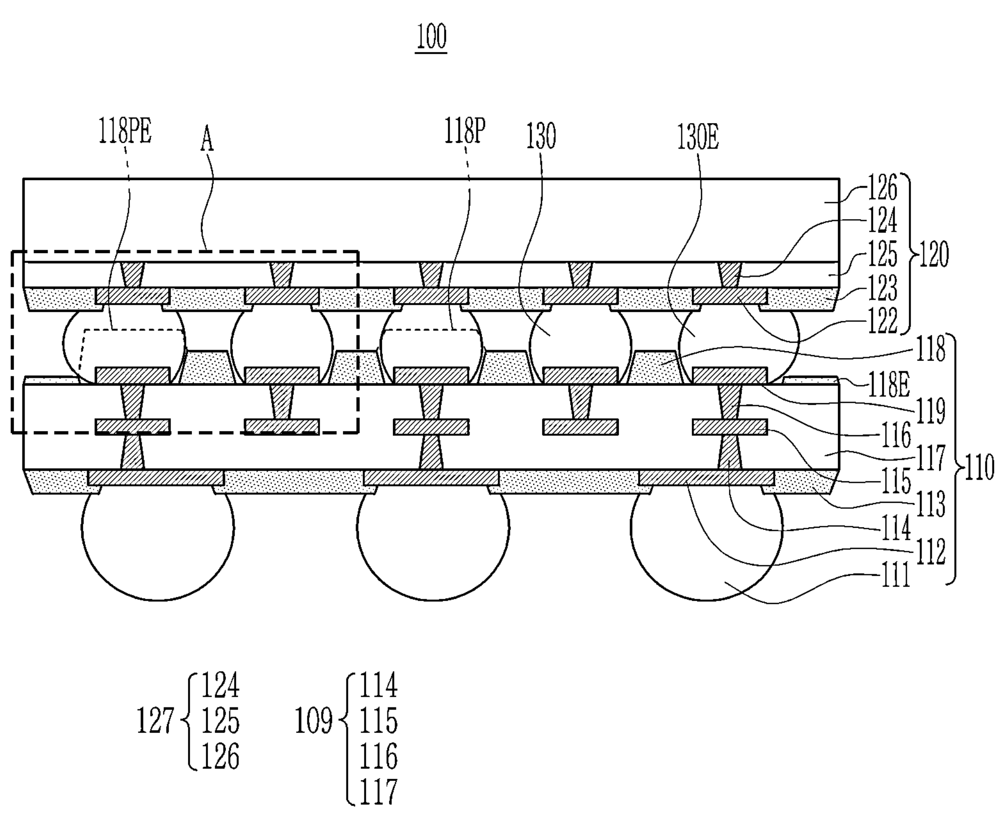
FIG. 2 is a cross-sectional view showing a semiconductor package according to an embodiment.

FIG. 2 is a cross-sectional view showing a semiconductor package according to an embodiment. In FIG. 2, the printed circuit board 110 may include the first connection pads 119, the first insulation member 118 having a height higher than the height of the first connection pads 119, and the second insulation member 118E having a height lower than the height of the first connection pads 119.

Referring to FIG. 2, the semiconductor package 100 may include the printed circuit board 110, a semiconductor die 120 and connection members 130. In an embodiment, the semiconductor package 100 may include fine-pitch ball grid array (FBGA) package.

The printed circuit board 110 may be a substrate that is capable of mounting various devices such as semiconductor dies, active elements, and passive elements, has a structure in which conductors and insulators are stacked in the form of a substrate, and serves to electrically connect various devices. The printed circuit board 110 may include external connection members 111, conductive pads 112, an insulation member 113, a first die base 109, the first insulation member 118, the second insulation member 118E, and the first connection pads 119. The first die base 109 may include first vias 114, a wiring layer 115, second vias 116, and a first insulation layer 117.

The external connection members 111 may electrically connect the printed circuit board 110 to external device. The external connection member 111 may contact a conductive pad 112. In an embodiment, the external connection member 111 may include solder balls or bumps. In an embodiment, the external connection member 111 may include at least one of tin, silver, lead, nickel, copper, or an alloy thereof.

The conductive pads 112 may be disposed between the first vias 114 and the external connection members 111. The conductive pad 112 may electrically connect a first via 114 to the external connection member 111. In an embodiment, the conductive pad 112 may include at least one of copper, nickel, zinc, gold, silver, platinum, palladium, chromium, titanium, and an alloy thereof. In an embodiment, the conductive pad 112 may be formed by performing a sputtering process or an electrolytic plating process after forming a seed metal layer.

The insulation member 113 may surround the conductive pads 112. The insulation member 113 may include a plurality of through openings for soldering. The insulation member 113 limits and/or prevents the external connection member 111 from being short-circuited. In an embodiment, the insulation member 113 may include a solder resist. In an embodiment, the insulation member 113 may be formed by performing processes of application, exposure, development, and curing.

The first vias 114 may be disposed between the conductive pads 112 and the wiring layer 115. The first via 114 may electrically connect the wiring layer 115 to conductive pad in a vertical direction. The wiring layer 115 may be disposed between the first vias 114 and the second vias 116. The wiring layer 115 may electrically connect the first vias 114 and the second vias 116 in a horizontal direction. The second vias 116 may be disposed between the wiring layer 115 and the first connection pads 119. The second via 116 may electrically connect a first connection pad 119 to the wiring layer 115 in the vertical direction. In an embodiment, the first vias 114, the wiring layer 115 and the second vias 116 may include at least one of copper, nickel, zinc, gold, silver, platinum, palladium, chromium, titanium, and an alloy thereof. In an embodiment, the first vias 114, the wiring layer 115 and the second vias 116 may be formed by electroless plating or electrolytic plating. In an embodiment, the first vias 114, the wiring layer 115 and the second vias 116 may be formed by sputtering.

The first insulation layer 117 protects and insulates the first vias 114, the wiring layer 115 and the second vias 116. The first insulation member 118, the second insulation member 118E, and the first connection pads 119 may be disposed on an upper surface of the first insulation layer 117. The conductive pads 112 and the insulation member 113 may be disposed on a bottom surface of the first insulation layer 117. In an embodiment, the first insulation layer 117 may include FR-4 (e.g., a glass reinforced epoxy laminate). In an embodiment, the first insulation layer 117 may include epoxy and glass fibers.

The first insulation member 118 may be disposed on the first insulation layer 117. The first insulation member 118 may surround a portion in the circumferential direction of a side surface of each of the outermost first connection pads 119 and all in the circumferential direction of a side surface of each of the remaining first connection pads 119. The first insulation member 118 may have a height higher than the height of the first connection pads 119. The first insulation member 118 may include the plurality of through openings 118P for soldering. In addition, the first insulation member 118 may form outermost through openings 118PE for soldering together with the second insulation member 118E. The first insulation member 118 limits and/or prevents the connection members 130 from being short-circuited. In an embodiment, the first insulation member 118 may include a solder resist. In an embodiment, the first insulation member 118 may be formed by performing processes of application, exposure, development, and curing.

The second insulation member 118E may be disposed on the first insulation layer 117. The second insulation member 118E may surround a portion in the circumferential direction of the side surface of each of the outermost first connection pads 119. The second insulation member 118E may have a height lower than the height of the first connection pads 119. The second insulation member 118E may form outermost through openings 118PE for soldering together with the first insulation member 118. The second insulation member 118E limits and/or prevents the solder paste before curing to the connection members 130 from leaking out of the printed circuit board 110. In an embodiment, the second insulation member 118E may include a solder resist. In an embodiment, the second insulation member 118E may be formed by performing processes of application, exposure, development, and curing.

The first connection pads 119 may be disposed between the second vias 116 and the connection members 130. The first connection pad 119 may electrically connect the connection member 130 to the second vias 116. In an embodiment, the first connection pad 119 may include at least one of copper, nickel, zinc, gold, silver, platinum, palladium, chromium, titanium, and an alloy thereof. In an embodiment, the first connection pad 119 may be formed by performing an electrolytic plating process after forming a seed metal layer, or performing a sputtering process.

The connection members 130 may be disposed between the first connection pads 119 and second connection pads 122. The connection member 130 may electrically connect the semiconductor die 120 connected to a second connection pad 122 to the printed circuit board 110 connected to the first connection pad 119. Outermost the connection members 130E among the connection members 130 may have a first side surface adjacent to the first insulation member 118 and a second side surface adjacent to the second insulation member 118E. The second side surface of the outermost connection members 130E may be further extended in the horizontal direction than the first side surface of the outermost connection members 130E. In an embodiment, the connection members 130 may include Sn, Ag, and Cu (SAC).

The semiconductor die 120 may include the second connection pads 122, a third insulation member 123, and a second die base 127. The second die base 127 may include a third via 124, a second insulation layer 125, and a third insulation layer 126. In the present disclosure, for mere convenience, with respect to the second die base 127, the third via 124, the second insulation layer 125, and the third insulation layer 126, which are an uppermost configuration of back end of line (BEOL) of the semiconductor die 120 for electrical connection to the printed circuit board 110, are shown, but other components in the third insulation layer 126 are omitted.

The second connection pads 122 may be disposed between a third vias 124 and the connection members 130. The second connection pad 122 may electrically connect the third via 124 to the connection member 130. In an embodiment, the second connection pad 122 may include at least one of copper, nickel, zinc, gold, silver, platinum, palladium, chromium, titanium, and an alloy thereof. In an embodiment, the second connection pad 122 may be formed by performing an electrolytic plating process after forming a seed metal layer, or performing a sputtering process.

The third insulation member 123 may surround the second connection pads 122. The third insulation member 123 may include the plurality of through openings for soldering. The third insulation member 123 limits and/or prevents the connection members 130 from being short-circuited. The third insulation member 123 may contact the second connection pads 122. In an embodiment, the third insulation member 123 may include a solder resist. In an embodiment, the third insulation member 123 may be formed by performing processes of application, exposure, development, and curing.

The third vias 124 may be electrically connected to the second connection pads 122. In an embodiment, the third vias 124 may include at least one of copper, nickel, zinc, gold, silver, platinum, palladium, chromium, titanium, and an alloy thereof. In an embodiment, the third vias 124 may be deposited by electroless plating or electrolytic plating. In an embodiment, the third vias 124 may be formed by sputtering process.

The second insulation layer 125 protects and insulates the third vias 124. The second connection pads 122 and the third insulation member 123 may be disposed on a bottom surface of the second insulation layer 125. In an embodiment, the second insulation layer 125 may include SiO2, SiOC, SiOH, SiOCH, or low dielectric constant insulation layer (low-k dielectric layer).

In the present disclosure, a specific quantities of insulation members, insulation layers, wiring layers, vias, external connection members, connection members, and connection pads are described and illustrated, a configuration including less or more quantities of insulation members, insulation layers, wiring layers, vias, external connection members, connection members, and connection pads may be included in the scope of the present disclosure.

Figure 3:
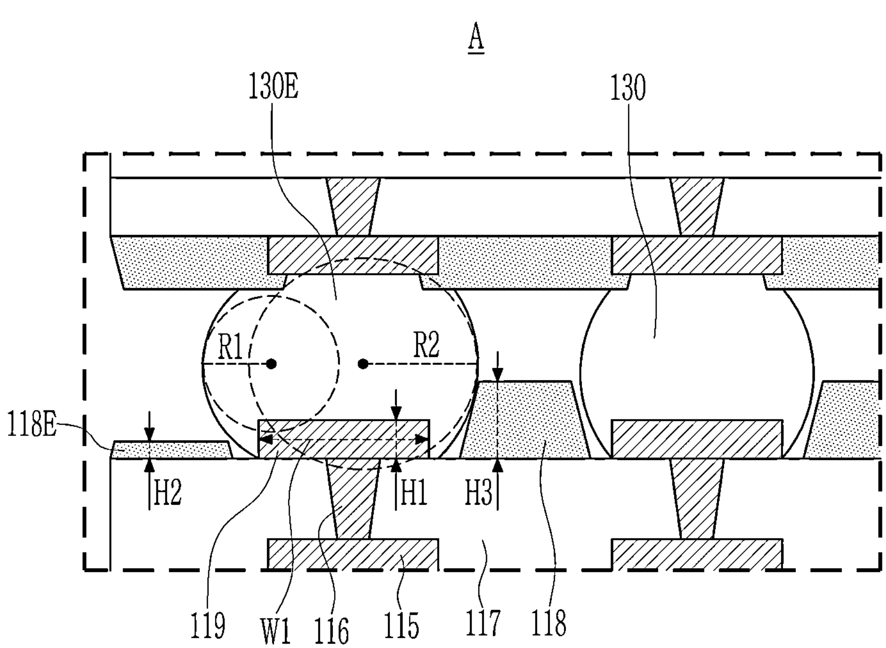
FIG. 3 is an enlarged cross-sectional view of region A of FIG. 2.

FIG. 3 is an enlarged cross-sectional view of region A of FIG. 2.

Referring to FIG. 3, the region A comprises the outermost connection member 130E among the connection members 130 electrically connect the printed circuit board 110 and the semiconductor die 120, and the connection member 130 next to the outermost connection member 130E.

The first insulation member 118 disposed on the first insulation layer 117 may include the plurality of through openings 118P (refer to FIG. 2). Outermost through openings 118PE (refer to FIG. 2) among the through openings 118P may include a first inner side surface defined by a side surface of the first insulation member 118 and a second inner side surface defined by a side surface of the second insulation member 118E. The first connection pad 119 may be disposed within a through opening 118P. The first connection pad 119 may be spaced apart from the first inner side surface of the through opening 118P and the second inner side surface of the through opening 118P. The upper surface of the first insulation layer 117 may be exposed within the through openings 118P.

When warpage occurs to the semiconductor package 100 to cause the solder pastes to collapse before curing to the connection members 130 during the reflow process in which the connection members 130 and the first connection pads 119 of the printed circuit board 110 are bonded, the solder pastes are circularly extended along the circular shape of the plurality of through openings 118P (refer to FIG. 2), and at this time, when the circularly extended solder pastes are cured in contact with each other, a short circuit may occur between the connection members 130.

In order to limit and/or prevent this, the insulation member surrounding the first connection pads 119 disposed below the outermost connection members 130E may be configured as the first insulation member 118 and the second insulation member 118E. The first insulation member 118 may surround a portion in the circumferential direction of a side surface of each of the first connection pads 119 disposed below the outermost connection members 130E and all in the circumferential direction of a side surface of each of remaining first connection pads 119, and the second insulation member 118E may surround a remaining portion in the circumferential direction of the side surface of each of the first connection pads 119 disposed below the outermost connection members 130E and the first insulation member 118. A height of the first insulation member 118 is higher than a height of the first connection pad 119, and a height of the second insulation member 118E may be lower than the height of the first connection pad 119.

In an embodiment, a height H3 of the first insulation member 118 may be about 2 times to about 3 times a height H1 of the first connection pads 119. In an embodiment, a height H2 of the second insulation member 118E may be about ½ times to about ¼ times the height H1 of the first connection pads 119. In an embodiment, the first connection pads 119 may have the height H1 of about 10 μm to about 25 μm. In an embodiment, the first connection pads 119 may have a width W1 of about 200 μm to about 300 μm.

In an embodiment, the first insulation member 118 may have the height H3 of about 20 μm to about 75 μm. When the height H3 of the first insulation member 118 is less than 20 μm, a short circuit may occur between first connection members 130. In addition, when the height H3 of the first insulation member 118 is greater than 75 μm, contact between the first insulation member 118 and the third insulation member 123 of the semiconductor die 120 may occur, and a contact failure (non-contact) the connection member 130 may occur between the first connection pad 119 and the second connection pad 122.

In an embodiment, the second insulation member 118E may have the height H2 of about 2.5 μm to about 12.5 μm. When the height H2 of the second insulation member 118E is less than 2.5 μm, the solder paste may flow in an exterior direction of the printed circuit board 110 during the reflow process. When the height H2 of the second insulation member 118E is greater than 12.5 μm, a short circuit may occur between the first connection members 130.

The outermost connection members 130E among the connection members 130 may include the first side surface adjacent to the first insulation member 118 and the second side surface adjacent to the second insulation member 118E. During the reflow process, the solder paste may flow in a direction toward the second insulation member 118E having the lower the height H2 rather than in a direction toward the first insulation member 118 having the higher the height H3. Therefore, the outermost connection members 130E may be further extended in the horizontal direction toward the second side surface than toward the first side surface. In addition, a curvature 1/R1 of the second side surface of the outermost connection members 130E may be larger than a curvature 1/R2 of the first side surface.

Figure 4:
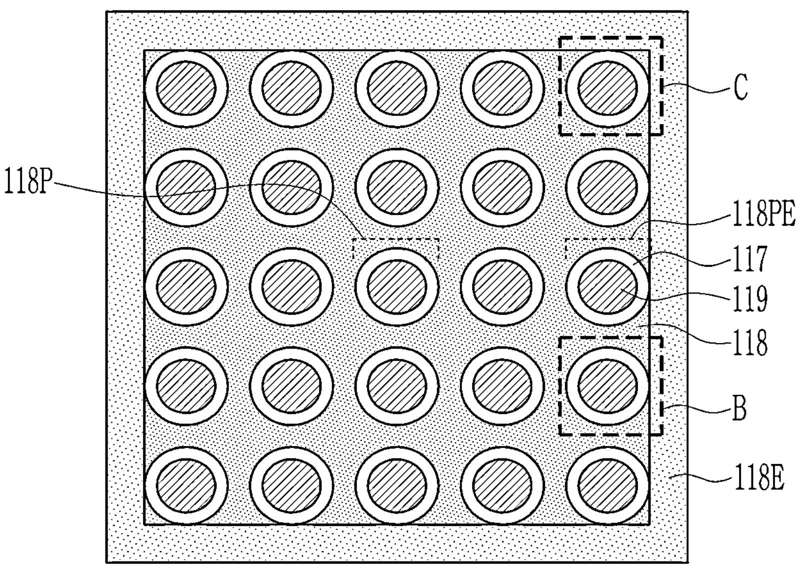
FIG. 4 is a top plan view showing an upper surface of the printed circuit board (PCB) according to an embodiment.

FIG. 4 is a top plan view showing an upper surface of the printed circuit board 110 according to an embodiment.

Referring to FIG. 4, the printed circuit board 110 may include the first insulation member 118 including the through openings 118P, and the second insulation member 118E surrounding the first insulation member 118. The through openings 118P may include the inner side surface defined by the side surface of the first insulation member 118. Outermost through openings 118PE may include the side surface of the first insulation member 118 and the inner side surface defined by the side surface of the second insulation member 118E. The first connection pad 119 may be disposed within the through opening 118P or outermost through opening 118PE. The first connection pad 119 may be spaced apart from the inner side surface of the through opening 118P, or from the inner side surface of the outermost through opening 118PE. The upper surface of the first insulation layer 117 may be exposed within the through openings 118P or outermost through openings 118PE.

Figure 5:
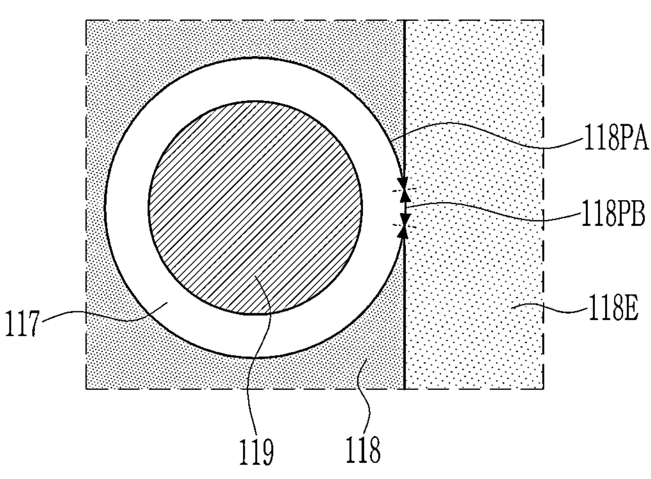
FIG. 5 is an enlarged top plan view of region B of FIG. 4.

FIG. 5 is an enlarged top plan view of region B of FIG. 4.

Referring to FIG. 5, the outermost through opening 118PE among the through openings 118P may include the first inner side surface 118PA defined by the side surface of the first insulation member 118 and the second inner side surface 118PB defined by the side surface of the second insulation member 118E. Most of the inner side surfaces of the outermost through openings 118PE corresponds to the first inner side surface 118PA, and a right portion contacting the second insulation member 118E among the inner side surfaces of the outermost through openings 118PE corresponds to the second inner side surface 118PB.

During the reflow process, the solder paste may flow in a direction toward the second inner side surface 118PB rather than in a direction toward the first inner side surface 118PA. Therefore, the outermost connection members 130E may be further extended, in the horizontal direction, in the direction toward the second inner side surface 118PB of a right portion contacting the second insulation member 118E rather than in the direction toward the first inner side surface 118PA.

Figure 6:
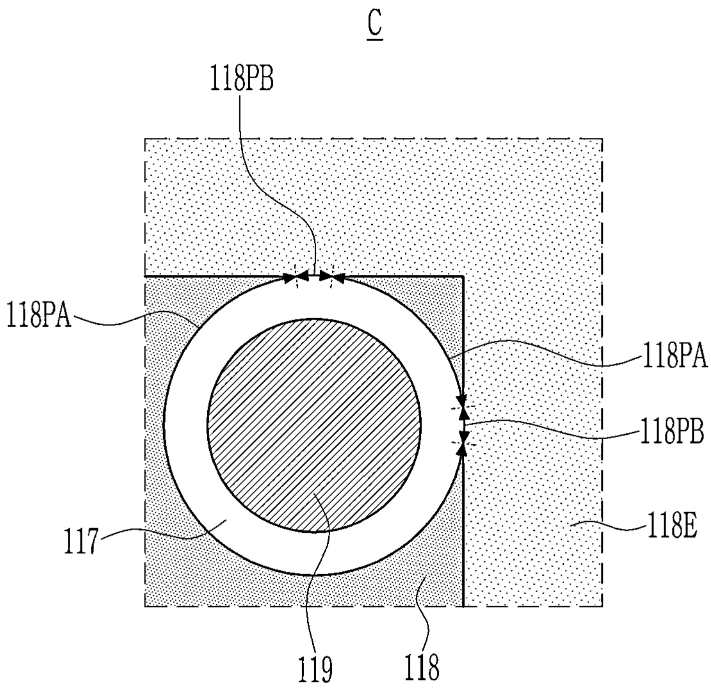
FIG. 6 is an enlarged top plan view of region C of FIG. 4.

FIG. 6 is an enlarged top plan view of region C of FIG. 4.

Referring to FIG. 6, the outermost through opening 118PE among the through openings 118P may include the first inner side surface 118PA defined by the side surface of the first insulation member 118 and the second inner side surface 118PB defined by the side surface of the second insulation member 118E. Most of the inner side surfaces of the outermost through openings 118PE corresponds to the first inner side surface 118PA, and an upper portion and a right portion contacting the second insulation member 118E among the inner side surfaces of the outermost through openings 118PE corresponds to the second inner side surface 118PB.

During the reflow process, the solder paste may flow in a direction toward the second inner side surface 118PB rather than in a direction toward the first inner side surface 118PA. Therefore, the outermost connection members 130E may be further extended, in the horizontal direction, in the direction toward the second inner side surface 118PB of an upper portion and a right portion contacting the second insulation member 118E rather than in the direction toward the first inner side surface 118PA.

Figure 7:
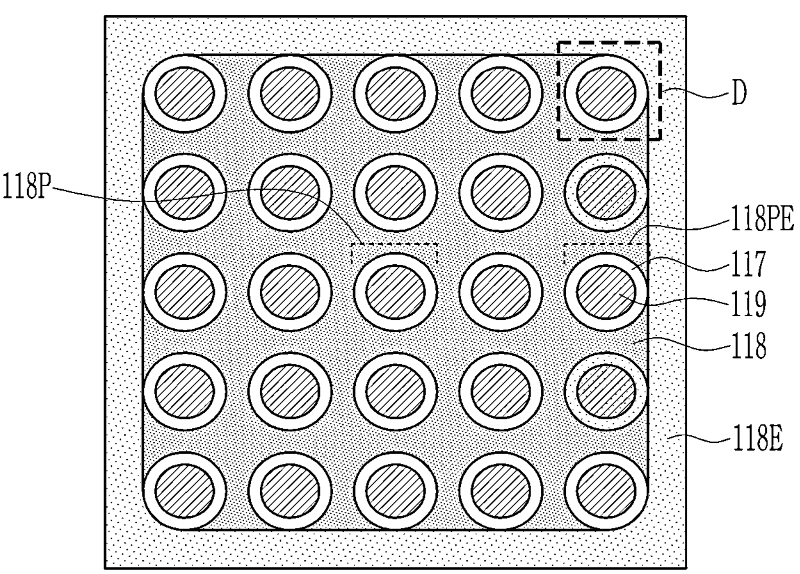
FIG. 7 is a top plan view showing an upper surface of the printed circuit board (PCB) according to an embodiment.

FIG. 7 is a top plan view showing the upper surface of the printed circuit board 110 according to an embodiment.

Referring to FIG. 7, the printed circuit board 110 may include the first insulation member 118 including the through openings 118P, and the second insulation member 118E surrounding the first insulation member 118. The through openings 118P may include the inner side surface defined by the side surface of the first insulation member 118. Outermost through openings 118PE may include the inner side surface defined by the side surface of the first insulation member 118 and the side surface of the second insulation member 118E. In the through openings 118PE positioned at the outermost corner, the inner surface of the corner portion may be defined by the side surface of the second insulation member 118E. The first connection pad 119 may be disposed within the through opening 118P or outermost through opening 118PE. The first connection pad 119 may be spaced apart from the inner side surface of the through opening 118P, or from the inner side surface of the outermost through opening 118PE. The upper surface of the first insulation layer 117 may be exposed within the through openings 118P or outermost through openings 118PE.

Figure 8:
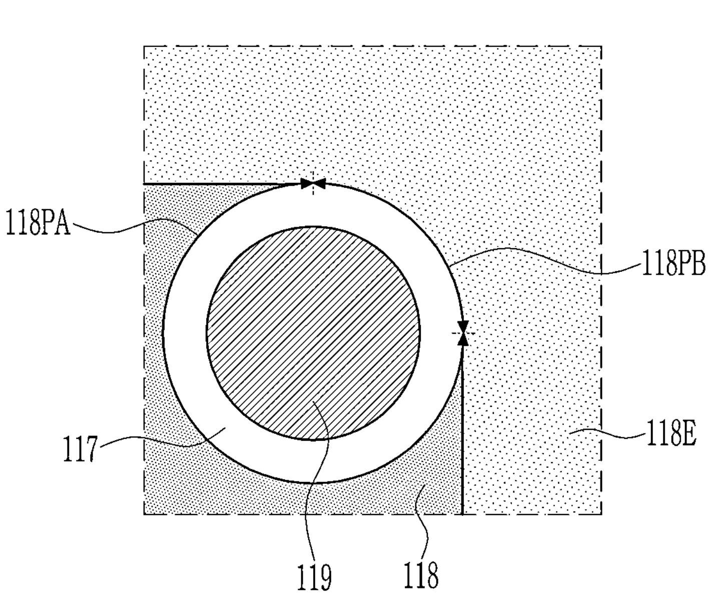
FIG. 8 is an enlarged top plan view of region D of FIG. 7.

FIG. 8 is an enlarged top plan view of region D of FIG. 7.

Referring to FIG. 8, the outermost through opening 118PE among the through openings 118P may include the first inner side surface 118PA defined by the side surface of the first insulation member 118 and the second inner side surface 118PB defined by the side surface of the second insulation member 118E. Most of the inner side surfaces of the outermost through openings 118PE corresponds to the first inner side surface 118PA, and a corner portion contacting the second insulation member 118E among the inner side surfaces of the outermost through openings 118PE corresponds to the second inner side surface 118PB. In an embodiment, a length of the second inner side surface 118PB may be about ¼ or less of an entire length of the inner side surface of the outermost through opening 118PE.

During the reflow process, the solder paste may flow in a direction toward the second inner side surface 118PB rather than in a direction toward the first inner side surface 118PA. Therefore, the outermost connection members 130E may be further extended, in the horizontal direction, in the direction toward the second inner side surface 118PB of a corner portion contacting the second insulation member 118E rather than in the direction toward the first inner side surface 118PA.

Figure 9:
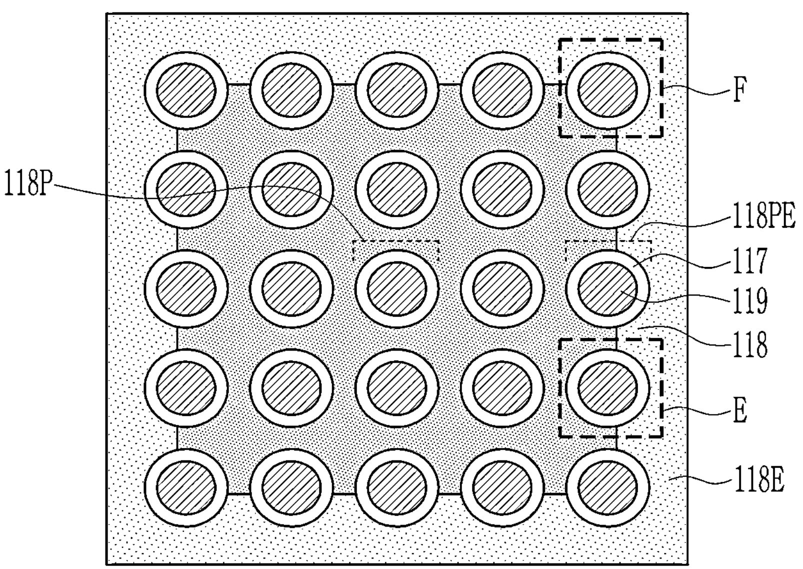
FIG. 9 is a top plan view showing an upper surface of the printed circuit board (PCB) according to an embodiment.

FIG. 9 is a top plan view showing the upper surface of the printed circuit board 110 according to an embodiment.

Referring to FIG. 9, the printed circuit board 110 may include the first insulation member 118 including the through openings 118P, and the second insulation member 118E surrounding the first insulation member 118. The through openings 118P may include the inner side surface defined by the side surface of the first insulation member 118. Outermost through openings 118PE may include the inner side surface defined by the side surface of the first insulation member 118 and the side surface of the second insulation member 118E. In the through openings 118PE positioned at the outermost corner, the inner surface of the upper portion and the right portion may be defined by the side surface of the second insulation member 118E. The first connection pad 119 may be disposed within the through opening 118P or outermost through opening 118PE. The first connection pad 119 may be spaced apart from the inner side surface of the through opening 118P, or from the inner side surface of the outermost through opening 118PE. The upper surface of the first insulation layer 117 may be exposed within the through openings 118P or outermost through openings 118PE.

Figure 10:
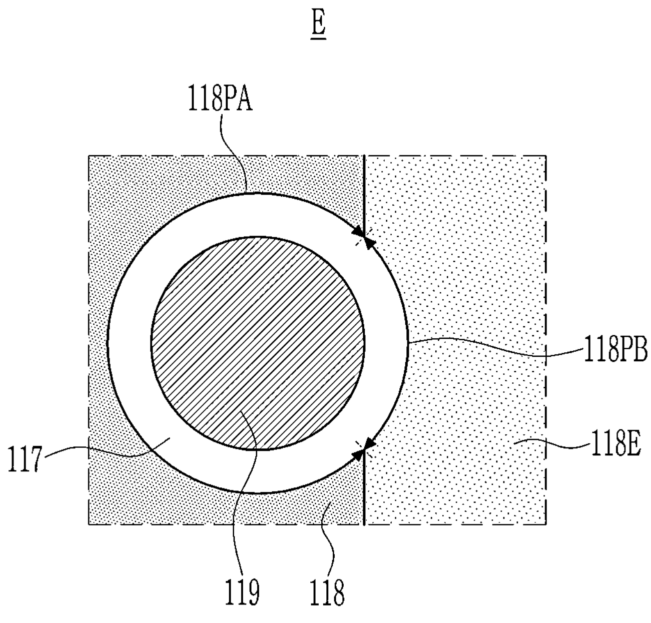
FIG. 10 is an enlarged top plan view of region E of FIG. 9.

FIG. 10 is an enlarged top plan view of region E of FIG. 9.

Referring to FIG. 10, the outermost through opening 118PE among the through openings 118P may include the first inner side surface 118PA defined by the side surface of the first insulation member 118 and the second inner side surface 118PB defined by the side surface of the second insulation member 118E. Most of the inner side surfaces of the outermost through openings 118PE corresponds to the first inner side surface 118PA, and a right portion contacting the second insulation member 118E among the inner side surfaces of the outermost through openings 118PE corresponds to the second inner side surface 118PB. The length of the second inner side surface 118PB in FIG. 10 may be greater than the length of the second inner side surface 118PB in FIG. 5. In an embodiment, the length of the second inner side surface 118PB may be less than or equal to about ½ of the entire length of the inner side surface of the outermost through opening 118PE.

During the reflow process, the solder paste may flow in a direction toward the second inner side surface 118PB rather than in a direction toward the first inner side surface 118PA. Therefore, the outermost connection members 130E may be further extended, in the horizontal direction, in the direction toward the second inner side surface 118PB of a right portion contacting the second insulation member 118E rather than in the direction toward the first inner side surface 118PA.

Figure 11:
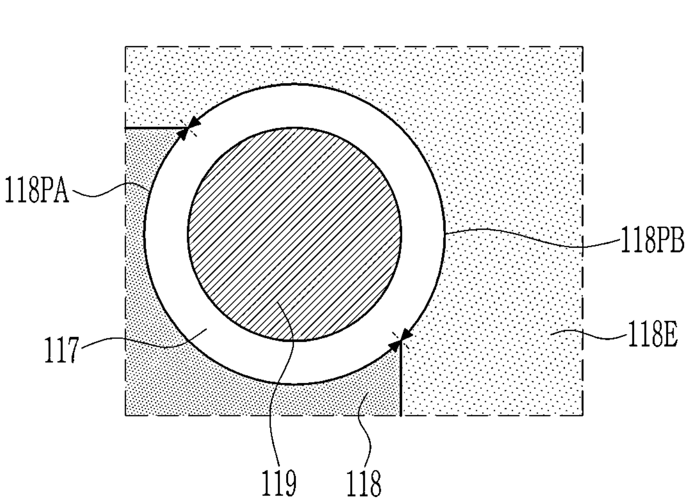
FIG. 11 is an enlarged top plan view of region F of FIG. 9.

FIG. 11 is an enlarged top plan view of region F of FIG. 9.

Referring to FIG. 11, the outermost through opening 118PE among the through openings 118P may include the first inner side surface 118PA defined by the side surface of the first insulation member 118 and the second inner side surface 118PB defined by the side surface of the second insulation member 118E. A corner portion contacting the second insulation member 118E among the inner side surfaces of the outermost through openings 118PE corresponds to the second inner side surface 118PB. The length of the second inner side surface 118PB of the outermost through opening 118PE may be set in consideration of the constraint that the solder pastes do not come into contact with each other by flowing during the reflow process. In an embodiment, the length of the second inner side surface 118PB may be about ¼ to about ¾ of the entire length of the inner surface of the outermost through opening 118PE.

During the reflow process, the solder paste may flow in a direction toward the second inner side surface 118PB rather than in a direction toward the first inner side surface 118PA. Therefore, the outermost connection members 130E may be further extended, in the horizontal direction, in the direction toward the second inner side surface 118PB of a corner portion contacting the second insulation member 118E rather than in the direction toward the first inner side surface 118PA.

FIG. 12 to FIG. 26 are cross-sectional views showing operations of a method for manufacturing a printed circuit board (PCB) according to an embodiment.

Figure 12:
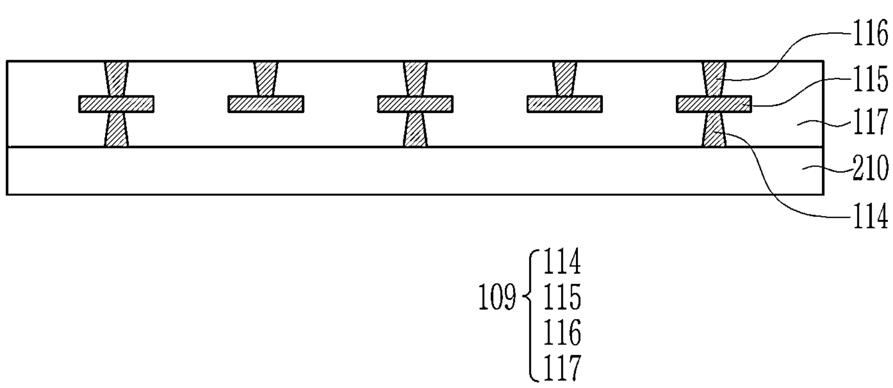
FIG. 12 to FIG. 26 are cross-sectional views showing operations of a method for manufacturing a printed circuit board (PCB) according to an embodiment.

FIG. 12 is a cross-sectional view showing attaching a base of the printed circuit board 110 on a carrier 210, as one of processes of a method for manufacturing the printed circuit board 110 according to an embodiment.

Referring to FIG. 12, the base of the printed circuit board 110 including the first insulation layer 117, and the first vias 114, the wiring layer 115 and the second vias 116 in the first insulation layer 117 is attached on the carrier 210. The carrier 210 may include, for example, a silicon-based material such as glass or silicon oxide, an organic material, or another material such as aluminum oxide, any combination of these materials, and the like.

Figure 13:
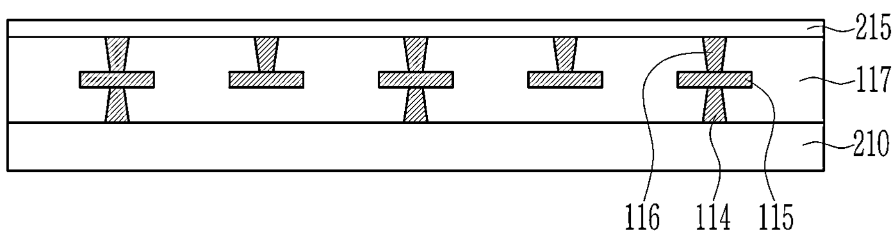

FIG. 13 is a cross-sectional view showing forming a first photoresist 215 on the base of the printed circuit board 110, as one of processes of a method for manufacturing a semiconductor package according to an embodiment.

Referring to FIG. 13, the first photoresist 215 is formed on the base of the printed circuit board 110. In an embodiment, the first photoresist 215 may be formed by a sputtering process, a physical vapor deposition (PVD) process, an atomic layer deposition (ALD) process, or a chemical vapor deposition (CVD) process, and the like. In another embodiment, the first photoresist 215 may be formed by spin coating. In an embodiment, the first photoresist 215 may include an organic polymer resin including a photoactive material.

Figure 14:
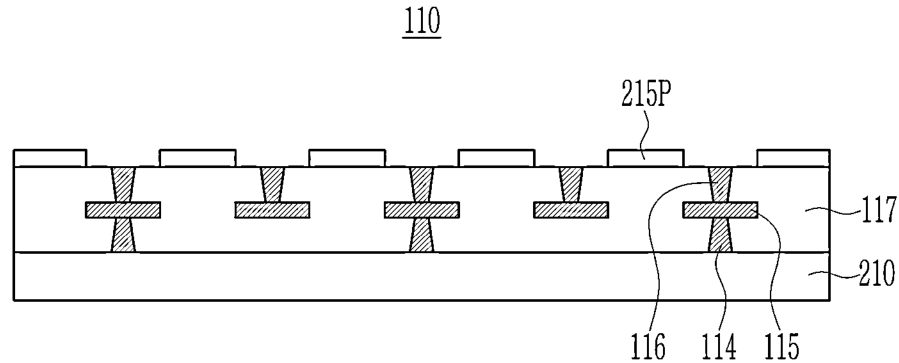

FIG. 14 is a cross-sectional view showing forming a first photoresist pattern 215P by exposing and developing the first photoresist 215, as one of processes of a method for manufacturing a semiconductor package according to an embodiment.

Referring to FIG. 14, a second photoresist pattern 215P is formed by exposing and developing the first photoresist 215.

Figure 15:
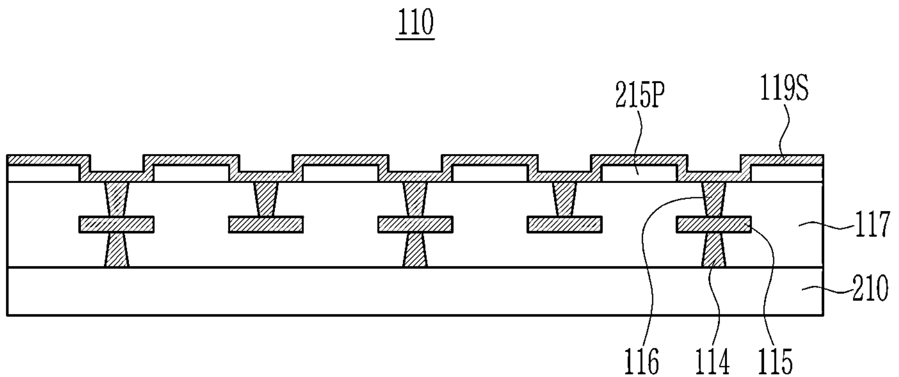

FIG. 15 is a cross-sectional view showing forming a seed metal layer 119S on the exposed the first insulation layer 117, the exposed the second vias 116, and the first photoresist pattern 215P, as one of processes of a method for manufacturing a semiconductor package according to an embodiment.

Referring to FIG. 15, the seed metal layer 119S is formed on the exposed the first insulation layer 117, the exposed the second vias 116 and the first photoresist pattern 215P. In an embodiment, the seed metal layer 119S may include copper. In an embodiment, the seed metal layer 119S is formed by electroless plating. In an embodiment, a cleaning process or a metal catalyst activation pretreatment process may be performed prior to electroless plating. In another embodiment, the seed metal layer 119S is formed by sputtering.

Figures 16, 17:
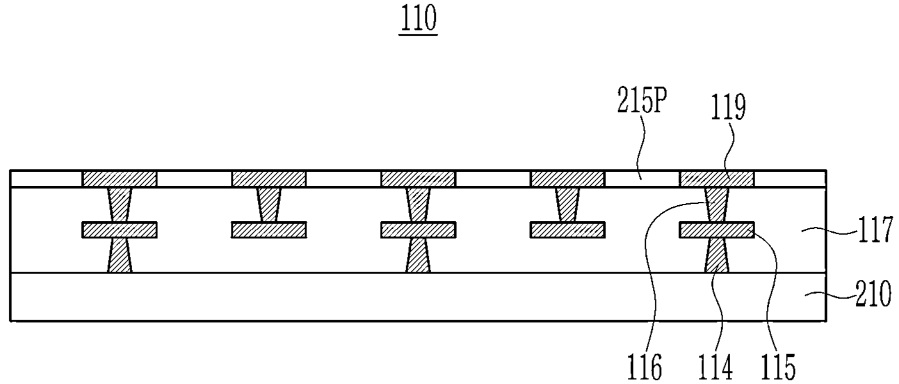

FIG. 16 is a cross-sectional view showing forming a metal layer 119A on the seed metal layer 119S, as one of processes of a method for manufacturing a semiconductor package according to an embodiment.

Referring to FIG. 16, the metal layer 119A is formed on the seed metal layer 119S. In an embodiment, the metal layer 119A may include copper. In an embodiment, the metal layer 119A is formed by electrolytic plating. A metal layer 119A is formed by growing a metal layer by electrolytic plating from the previously formed seed metal layer 119S. In an embodiment, an annealing process may be performed after forming the metal layer 119A.

FIG. 17 is a cross-sectional view showing forming connection pads 119 by planarizing an upper surface of the metal layer 119A, as one of processes of a method for manufacturing a semiconductor package according to an embodiment.

Referring to FIG. 17, the upper surface of the metal layer 119A is planarized by applying a chemical mechanical planarization (CMP) process or a mechanical grinding process.

Figure 18:
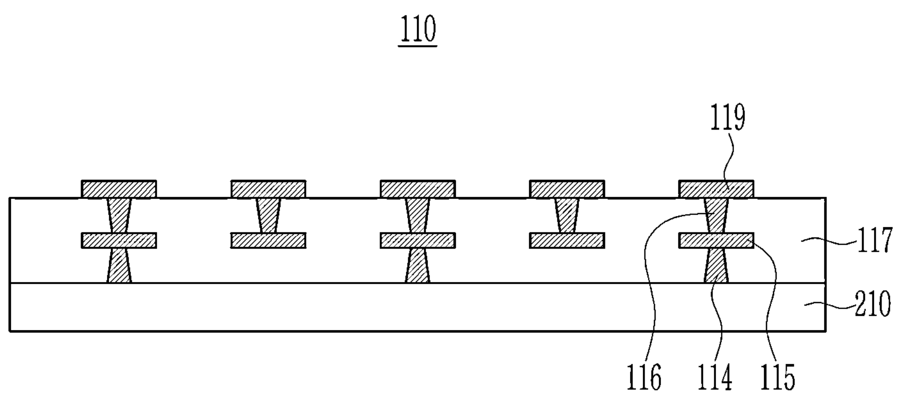

FIG. 18 is a cross-sectional view showing removing the first photoresist pattern 215P, as one of processes of a method for manufacturing a semiconductor package according to an embodiment.

Referring to FIG. 18, the first photoresist pattern 215P between the metal layers 119A is removed. In an embodiment, the first photoresist pattern 215P may be removed by at least one of etching, ashing, and stripping.

Figure 19:
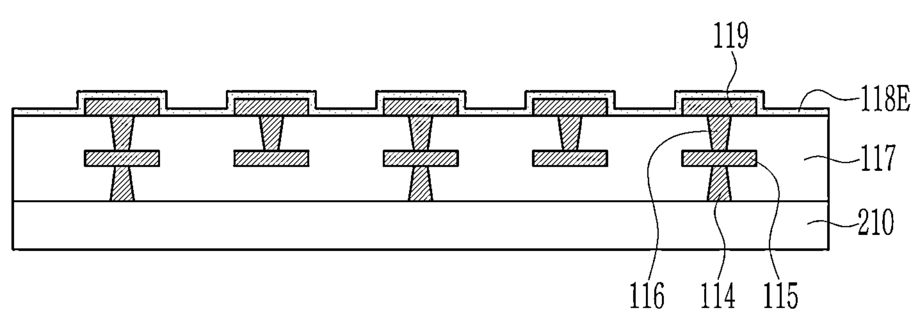

FIG. 19 is a cross-sectional view showing forming a first solder resist 118E on the first connection pads 119 and the exposed the first insulation layer 117, as one of processes of a method for manufacturing a semiconductor package according to an embodiment.

Referring to FIG. 19, the first solder resist 118E is applied on the first connection pads 119 and on the exposed the first insulation layer 117.

Figure 20:
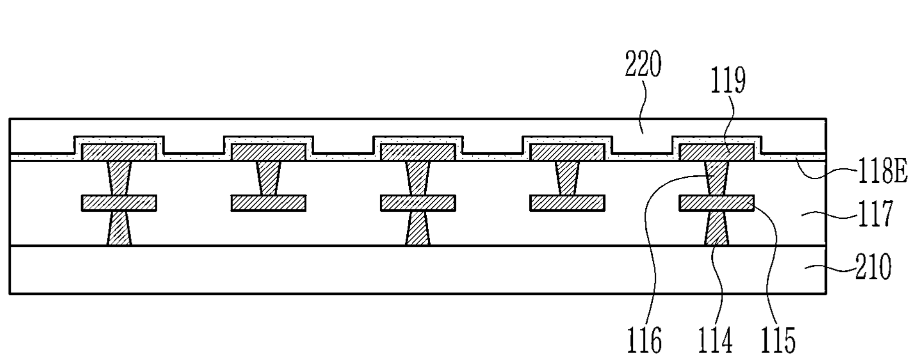

FIG. 20 is a cross-sectional view showing forming a second photoresist 220 on the first solder resist 118E, as one of processes of a method for manufacturing a semiconductor package according to an embodiment.

Referring to FIG. 20, the second photoresist 220 is formed on the first solder resist 118E. In an embodiment, the second photoresist 220 may be formed by a sputtering process, a physical vapor deposition (PVD) process, an atomic layer deposition (ALD) process, or a chemical vapor deposition (CVD) process, and the like. In another embodiment, the second photoresist 220 may be formed by spin coating. In an embodiment, the second photoresist 220 may include an organic polymer resin including a photoactive material.

Figure 21:
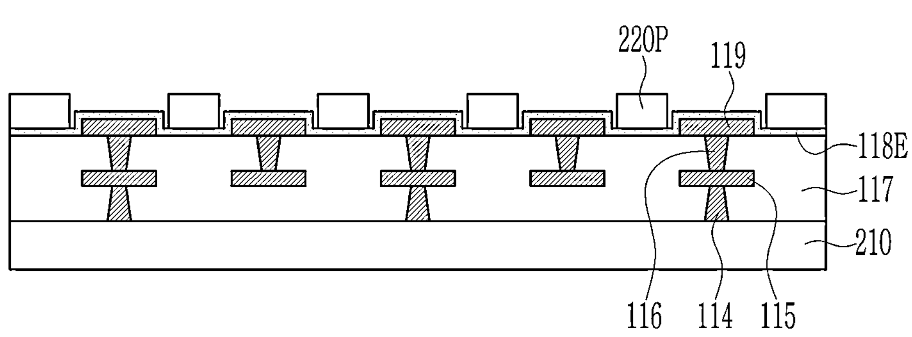

FIG. 21 is a cross-sectional view showing forming a second photoresist pattern 220P by exposing and developing the second photoresist 220, as one of processes of a method for manufacturing a semiconductor package according to an embodiment.

Referring to FIG. 21, the second photoresist pattern 220P is formed by exposing and developing the second photoresist 220.

Figure 22:
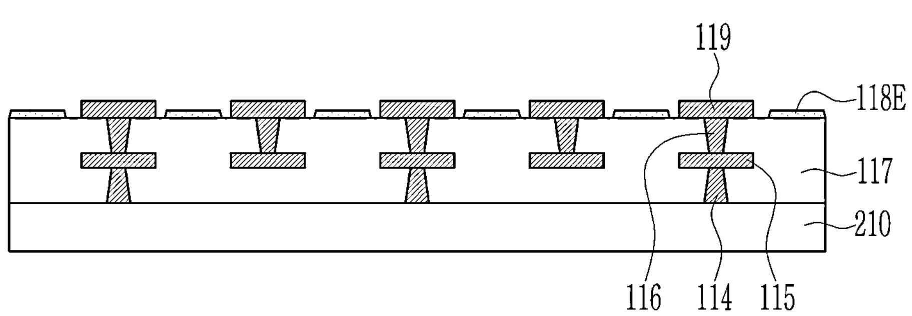

FIG. 22 is a cross-sectional view showing removing the exposed first solder resist 118E using the second photoresist pattern 220P as a mask, and removing the second photoresist pattern 220P, as one of processes of a method for manufacturing a semiconductor package according to an embodiment.

Referring to FIG. 22, the exposed first solder resist 118E is etched using the second photoresist pattern 220P as a mask. Thereafter, the remaining second photoresist pattern 220P is removed. In an embodiment, the second photoresist pattern 220P may be removed by at least one of etching, ashing, and stripping.

Figure 23:
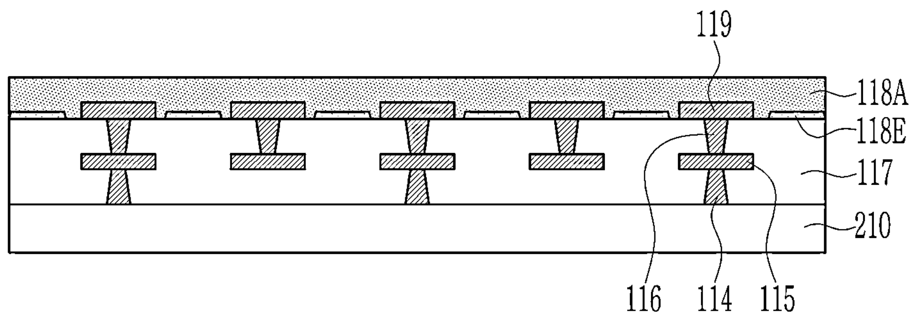

FIG. 23 is a cross-sectional view showing forming a second solder resist 118A on the first solder resist 118E, the first connection pads 119, and the first insulation layer 117, as one of processes of a method for manufacturing a semiconductor package according to an embodiment.

Referring to FIG. 23, the second solder resist 118A is applied on the first solder resist 118E, the first connection pads 119, and the first insulation layer 117.

Figure 24:
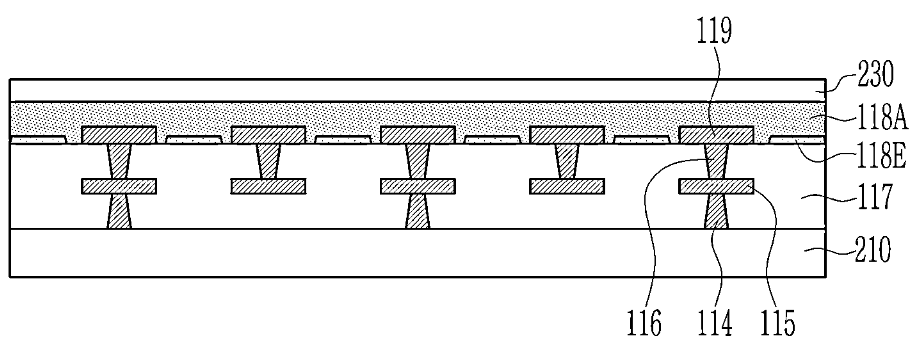

FIG. 24 is a cross-sectional view showing forming a third photoresist 230 on the second solder resist 118A, as one of processes of a method for manufacturing a semiconductor package according to an embodiment.

Referring to FIG. 24, the third photoresist 230 is formed on the second solder resist 118A. In an embodiment, the third photoresist 230 may be formed by a sputtering process, a physical vapor deposition (PVD) process, an atomic layer deposition (ALD) process, or a chemical vapor deposition (CVD) process, and the like. In another embodiment, the third photoresist 230 may be formed by spin coating. In an embodiment, the third photoresist 230 may include an organic polymer resin including a photoactive material.

Figure 25:
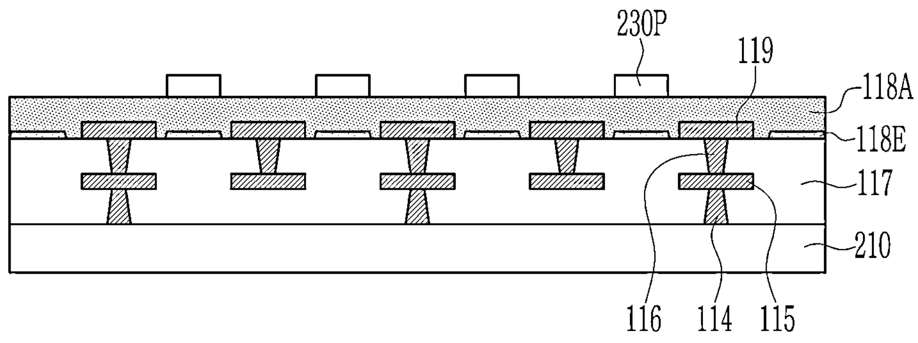

FIG. 25 is a cross-sectional view showing forming a third photoresist pattern 230P by exposing and developing the third photoresist 230, as one of processes of a method for manufacturing a semiconductor package according to an embodiment.

Referring to FIG. 25, the third photoresist pattern 230P is formed by exposing and developing the third photoresist 230.

Figure 26:
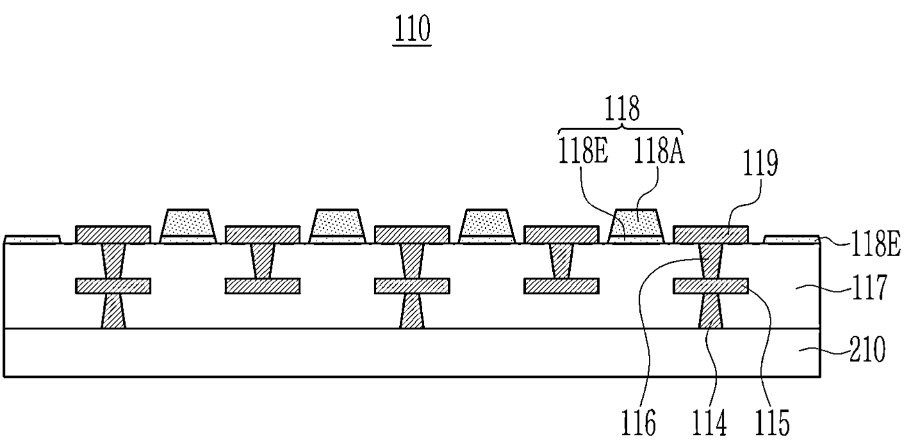

FIG. 26 is a cross-sectional view showing removing the exposed second solder resist 118A using the third photoresist pattern 230P as a mask, and removing the third photoresist pattern 230P, as one of processes of a method for manufacturing a semiconductor package according to an embodiment.

Referring to FIG. 26, the exposed second solder resist 118A is etched using the third photoresist pattern 230P as a mask. Thereafter, the remaining third photoresist pattern 230P is removed. In an embodiment, the third photoresist pattern 230P may be removed by at least one of etching, ashing, and stripping.

Accordingly, the printed circuit board 110 including the first connection pads 119, the first insulation member 118 having a height higher than the height of the first connection pads 119, and the second insulation member 118E having a height lower than the height of the first connection pads 119 may be formed.

Figure 27:
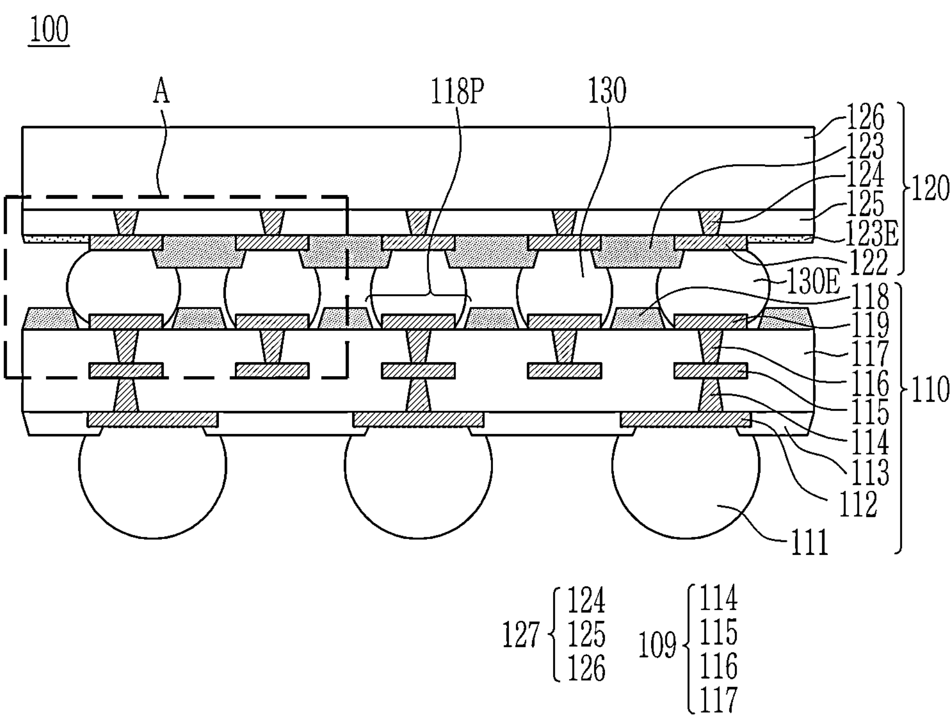
FIG. 27 is a cross-sectional view showing a semiconductor package of another embodiment.

FIG. 27 is a cross-sectional view showing a semiconductor package 100 according to an embodiment. In FIG. 27, the semiconductor die 120 may include the second connection pads 122, the third insulation member 123 having a height higher than a height of the second connection pads 122, and a fourth insulation member 123E having a height lower than the height of the second connection pads 122.

Referring to FIG. 27, the semiconductor package 100 may include the printed circuit board 110, the semiconductor die 120 and the connection members 130. In an embodiment, the semiconductor package 100 may include fine-pitch ball grid array (FBGA) package.

The printed circuit board 110 may include the external connection members 111, the conductive pads 112, the insulation member 113, the first die base 109, the first insulation member 118, and the first connection pads 119. The first die base 109 may include the first vias 114, the wiring layer 115, the second vias 116, and the first insulation layer 117.

The external connection members 111 may electrically connect the printed circuit board 110 to external device. The external connection member 111 may contact a conductive pad 112. In an embodiment, the external connection member 111 may include solder balls or bumps. In an embodiment, the external connection member 111 may include at least one of tin, silver, lead, nickel, copper, or an alloy thereof.

The conductive pads 112 may be disposed between the first vias 114 and the external connection members 111. The conductive pad 112 may electrically connect a first via 114 to the external connection member 111. In an embodiment, the conductive pad 112 may include at least one of copper, nickel, zinc, gold, silver, platinum, palladium, chromium, titanium, and an alloy thereof. In an embodiment, the conductive pad 112 may be formed by performing a sputtering process or an electrolytic plating process after forming a seed metal layer.

The insulation member 113 may surround the conductive pads 112. The insulation member 113 may include a plurality of through openings for soldering. The insulation member 113 limits and/or prevents the external connection member 111 from being short-circuited. In an embodiment, the insulation member 113 may include a solder resist. In an embodiment, the insulation member 113 may be formed by performing processes of application, exposure, development, and curing.

The first vias 114 may be disposed between the conductive pads 112 and the wiring layer 115. The first via 114 may electrically connect the wiring layer 115 to conductive pad in a vertical direction. The wiring layer 115 may be disposed between the first vias 114 and the second vias 116. The wiring layer 115 may electrically connect the first vias 114 and the second vias 116 in a horizontal direction. The second vias 116 may be disposed between the wiring layer 115 and the first connection pads 119. The second via 116 may electrically connect the first connection pad 119 to the wiring layer 115 in the vertical direction. In an embodiment, the first vias 114, the wiring layer 115 and the second vias 116 may include at least one of copper, nickel, zinc, gold, silver, platinum, palladium, chromium, titanium, and an alloy thereof. In an embodiment, the first vias 114, the wiring layer 115 and the second vias 116 may be formed by electroless plating or electrolytic plating. In an embodiment, the first vias 114, the wiring layer 115 and the second vias 116 may be formed by sputtering.

The first insulation layer 117 protects and insulates the first vias 114, the wiring layer 115 and the second vias 116. The first insulation member 118 and the first connection pads 119 may be disposed on the upper surface of the first insulation layer 117. The conductive pads 112 and the insulation member 113 may be disposed on a bottom surface of the first insulation layer 117. In an embodiment, the first insulation layer 117 may include FR-4. In an embodiment, the first insulation layer 117 may include epoxy and glass fibers.

The first insulation member 118 may be disposed on the first insulation layer 117. The first insulation member 118 may surround side surfaces of the first connection pads 119*s*. The first insulation member 118 may include the plurality of through openings 118P for soldering. The first insulation member 118 limits and/or prevents the connection members 130 from being short-circuited. In an embodiment, the first insulation member 118 may include a solder resist. In an embodiment, the first insulation member 118 may be formed by performing processes of application, exposure, development, and curing.

The first connection pads 119 may be disposed between the second vias 116 and the connection members 130. The first connection pad 119 may electrically connect the connection member 130 to the second via 116. In an embodiment, the first connection pad 119 may include at least one of copper, nickel, zinc, gold, silver, platinum, palladium, chromium, titanium, and an alloy thereof. In an embodiment, the first connection pad 119 may be formed by performing an electrolytic plating process after forming a seed metal layer, or performing a sputtering process.

The connection members 130 may be disposed between the first connection pads 119 and the second connection pads 122. The connection member 130 may electrically connect the semiconductor die 120 connected to the second connection pad 122 to the printed circuit board 110 connected to the first connection pad 119. Outermost the connection members 130E among the connection members 130 may have a first side surface adjacent to the third insulation member 123 and a second side surface adjacent to the fourth insulation member 123E. The second side surface of the outermost connection members 130E may be further extended in the horizontal direction than the first side surface of the outermost connection members 130E. The horizontal direction is a direction parallel to a direction of a bottom surface of the semiconductor die 120. In an embodiment, the connection members 130 may include Sn, Ag, and Cu (SAC).

The semiconductor die 120 may include the second connection pads 122, the third insulation member 123, the fourth insulation member 123E, and the second die base 127. The second die base 127 may include the third via 124, the second insulation layer 125, and the third insulation layer 126. In the present disclosure, for mere convenience, with respect to the second die base 127, the third via 124, the second insulation layer 125, and the third insulation layer 126 which are an uppermost configuration of back end of line (BEOL) of the semiconductor die 120 for electrical connection to the printed circuit board 110, are shown, but other components in the third insulation layer 126 are omitted.

The second connection pads 122 may be disposed between a third vias 124 and the connection members 130. The second connection pad 122 may electrically connect the third via 124 to the connection member 130. In an embodiment, the second connection pad 122 may include at least one of copper, nickel, zinc, gold, silver, platinum, palladium, chromium, titanium, and an alloy thereof. In an embodiment, the second connection pad 122 may be formed by performing an electrolytic plating process after forming a seed metal layer, or performing a sputtering process.

The third insulation member 123 may be disposed below the second insulation layer 125. The third insulation member 123 may surround a portion in the circumferential direction of a side surface of each of the outermost second connection pads 122 and all in the circumferential direction of a side surface of each of the remaining second connection pads 122. The third insulation member 123 may have a height higher than the height of the second connection pads 122. The third insulation member 123 may surround side surfaces of the outermost second connection pads 122 together with the fourth insulation member 123E. The third insulation member 123 may cover a portion of edge of one surface of the outermost second connection pads 122. The one surface of the second connection pads 122 may be a surface facing the printed circuit board 110. The third insulation member 123 has a function of limiting and/or preventing the connecting members 130 from being short-circuited. In an embodiment, the third insulation member 123 may include a solder resist. In an embodiment, the third insulation member 123 may be formed by performing processes of application, exposure, development, and curing.

The fourth insulation member 123E may be disposed below the second insulation layer 125. The fourth insulation member 123E may surround a portion in the circumferential direction of the side surface of each of the outermost second connection pads 122. The fourth insulation member 123E may have a height lower than the height of the outermost second connection pads 122. The fourth insulation member 123E may surround the side surfaces of the outermost second connection pads 122 in the circumferential direction together with the third insulation member 123. The fourth insulation member 123E limits and/or prevents the solder paste before curing to the connection members 130 from leaking out of the printed circuit board 110 (the semiconductor die 120). In an embodiment, the fourth insulation member 123E may include a solder resist. In an embodiment, the fourth insulation member 123E may be formed by performing processes of application, exposure, development, and curing.

The third vias 124 may be electrically connected to the second connection pads 122. In an embodiment, the third vias 124 may include at least one of copper, nickel, zinc, gold, silver, platinum, palladium, chromium, titanium, and an alloy thereof. In an embodiment, the third vias 124 may be deposited by electroless plating or electrolytic plating. In an embodiment, the third vias 124 may be formed by sputtering process.

The second insulation layer 125 may protect and insulate the third vias 124. The second connection pads 122, the third insulation member 123, and the fourth insulation member 123E may be disposed on the bottom surface of the second insulation layer 125. In an embodiment, the second insulation layer 125 may include SiO2, SiOC, SiOH, SiOCH, or low dielectric constant insulation layer (low-k dielectric layer).

In the present disclosure, a specific quantities of insulation members, insulation layers, wiring layers, vias, external connection members, connection members, and connection pads are described and illustrated, a configuration including less or more quantities of insulation members, insulation layers, wiring layers, vias, external connection members, connection members, and connection pads may be included in the scope of the present disclosure.

Figure 28:
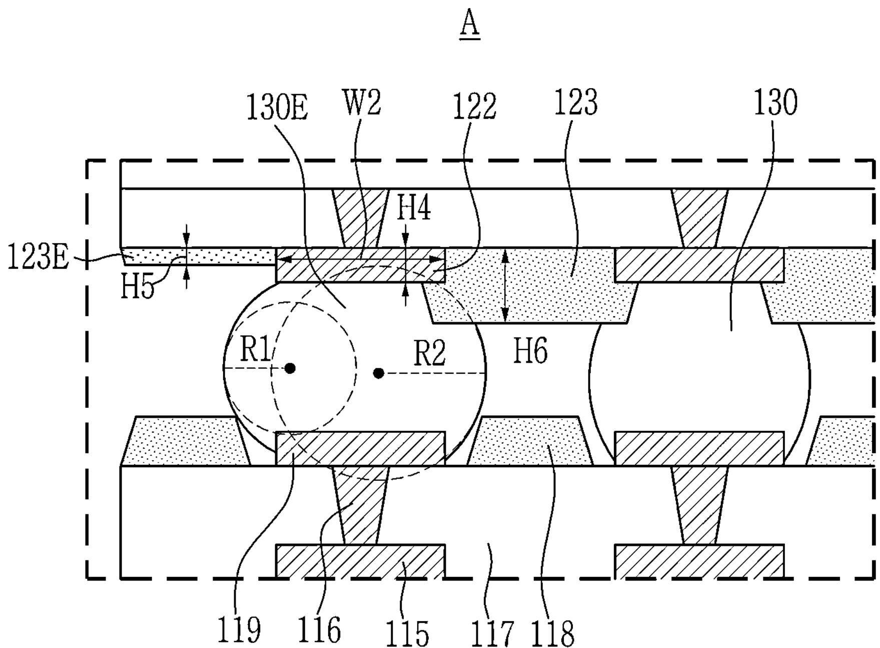
FIG. 28 is an enlarged cross-sectional view of region A of FIG. 27.

FIG. 28 is an enlarged cross-sectional view of region A of FIG. 27.

Referring to FIG. 28, the region A comprises the outermost connection member 130E among the connection members 130 electrically connect the printed circuit board 110 and the semiconductor die 120, and the connection member 130 next to the outermost connection member 130E.

The connection member 130 may be disposed to contact a bottom surface of the second connection pad 122. The connection member 130 may be electrically connected to the second connection pad 122.

The second connection pad 122 electrically connected to the connection member 130 may be surrounded by the third insulation member 123. A side surface of the second connection pad 122 electrically connected to the connection member 130 may be cover by the third insulation member 123. The side surface of the second connection pad 122 electrically connected to the connection member 130 may contact the third insulation member 123. A portion of one surface (bottom surface) of the second connection pad 122 electrically connected to the connection member 130 may be cover by the third insulation member 123. A portion of one surface (bottom surface) of the second connection pad 122 may contact the third insulation member 123. Another portion of one surface (bottom surface) of the second connection pad 122 electrically connected to the connection member 130 may be exposed from the third insulation member 123 to contact the connection member 130.

When warpage occurs to the semiconductor package 100 to cause the solder pastes to collapse before curing to the connection members 130 during the reflow process in which the connection members 130 and the first connection pads 119 of the printed circuit board 110 are bonded, the solder pastes are circularly extended along the circular shape of the plurality of through openings 118P (refer to FIG. 27), and at this time, when the circularly extended solder pastes are cured in contact with each other, a short circuit may occur between the connection members 130.

In order to limit and/or prevent this, the insulation member surrounding the outermost second connection pads 122 (the second connection pads 122 disposed on the outermost connection members 130E) may be configured as the third insulation member 123 and the fourth insulation member 123E.

The outermost second connection pads 122 may be surrounded by the third insulation member 123 and the fourth insulation member 123E. A side surface of the outermost second connection pad 122 may be cover by the third insulation member 123 and the fourth insulation member 123E. The side surface of the outermost second connection pad 122 may contact the third insulation member 123 and the fourth insulation member 123E.

The third insulation member 123 may surround a portion in the circumferential direction of the side surface of each of the outermost second connection pads 122 and all in the circumferential direction of the side surface of each of the remaining second connection pads 122. The third insulation member 123 may over a portion of one surface (bottom surface) of the outermost second connection pads 122, and cover a portion of one surface (bottom surface) of the remaining second connection pads 122.

The fourth insulation member 123E may surround a remaining portion in the circumferential direction of the side surface of each of the outermost second connection pads 122 (a remaining portion not surrounded by the third insulation member 123) and the third insulation member 123. A height H6 of the third insulation member 123 may be formed to be higher than a height H4 of the second connection pad 122, a height H5 of the fourth insulation member 123E may be formed to be lower than the height H4 of the second connection pad 122.

In an embodiment, the height H6 of the third insulation member 123 may be about two times to about three times of the height H4 of the second connection pads 122. In an embodiment, the height H5 of the fourth insulation member 123E may be about ½ to about ¼ times the height H4 of the second connection pads 122. In an embodiment, the second connection pads 122 may have the height H4 of about 10 μm to about 25 μm. In an embodiment, the second connection pads 122 may have a width W2 of about 200 μm to about 300 μm.

In an embodiment, the third insulation member 123 may have the height H6 of about 20 μm to about 75 μm. When the height H6 of the third insulation member 123 is less than 20 μm, a short circuit may occur between the connection members 130. In addition, when the height H6 of the third insulation member 123 is greater than 75 μm, contact between the third insulation member 123 and the first insulation member 118 of the printed circuit board 110 may occur, and a contact failure (non-contact) the connection member 130 may occur between the first connection pad 119 and the second connection pad 122.

In an embodiment, the fourth insulation member 123E may have the height H5 of about 2.5 μm to about 12.5 μm. When the height H2 of the second insulation member 118E is less than 2.5 μm, the solder paste may flow in an exterior direction of the printed circuit board 110 during the reflow process. When the height H5 of the fourth insulation member 123E exceeds 12.5 μm, a short circuit may occur between the outermost connection members 130E and the connection members 130.

The outermost connection members 130E among the connection members 130 may include the first side surface adjacent to the third insulation member 123 and the second side surface adjacent to the fourth insulation member 123E. During the reflow process, the solder paste may flow in a direction toward the fourth insulation member 123E having the lower the height H5 rather than in a direction toward the third insulation member 123 having the higher the height H6. Therefore, the outermost connection members 130E may be further extended in the horizontal direction toward the second side surface than toward the first side surface. In addition, a curvature 1/R1 of the second side surface of the outermost connection members 130E may be larger than a curvature 1/R2 of the first side surface.

Figure 29:
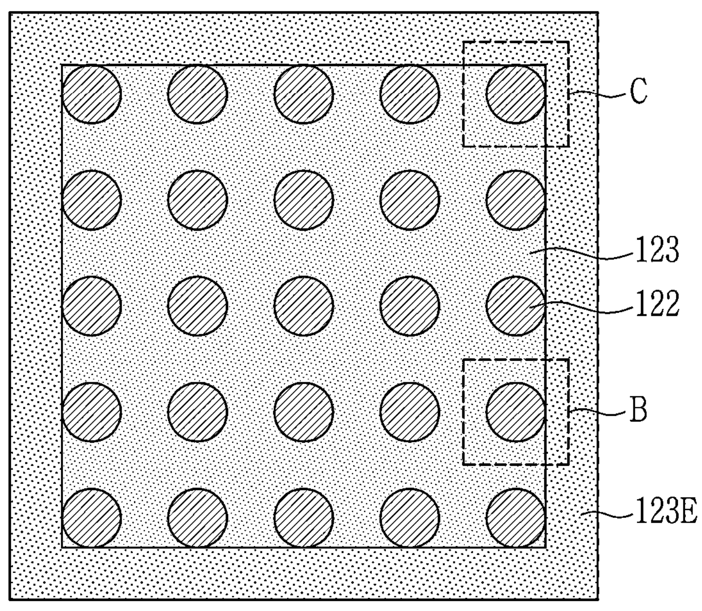
FIG. 29 is a top plan view showing a bottom surface of a semiconductor die according to an embodiment.

FIG. 29 is a plan view showing the bottom surface of the semiconductor die 120 according to an embodiment.

Referring to FIG. 29, the semiconductor die 120 may include the third insulation member 123 configured to surround a portion of each side surface of the outermost second connection pads 122 and remaining second connection pads, and the fourth insulation member 123E configured to surround a portion of each side surface of the outermost second connection pads 122 and the third insulation member 123. The outermost second connection pads 122 may include a side surface defined by a side surface of the third insulation member 123 and a side surface of the fourth insulation member 123E. The third insulation member 123 may surround at least a portion in the circumferential direction of the side surface of each of the second connection pads 122. The fourth insulation member 123E may surround the third insulation member 123 and a remaining portion of the side surfaces of the second connection pads 122 in the circumferential direction.

Figure 30:
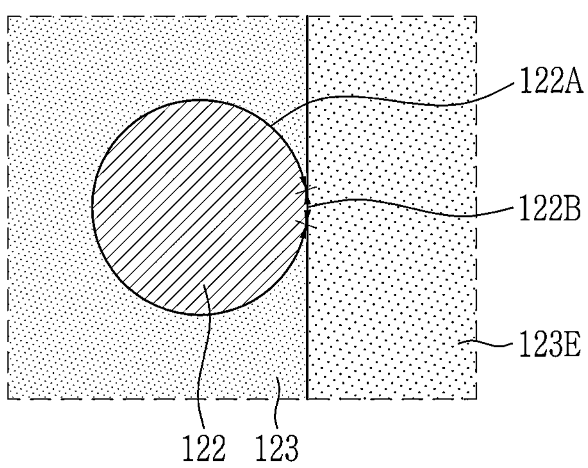
FIG. 30 is an enlarged top plan view of region B of FIG. 29.

FIG. 30 is an enlarged top plan view of region B of FIG. 29.

Referring to FIG. 30, the outermost second connection pad 122 among the second connection pads 122 may include a first side surface 122A contacting the side surface of the third insulation member 123 and a second side surface 122B contacting the side surface of the fourth insulation member 123E. Most of the side surface of the outermost second connection pad 122 may correspond to the first side surface 122A, and the right portion among the side surface of the outermost second connection pad 122 contacting the fourth insulation member 123E may correspond to the second side surface 122B.

The solder paste during the reflow process may flow in a direction toward the second side surface 122B surrounded by the fourth insulation member 123E having the height H5 lower than the height H4 of the second connection pads 122 rather than in a direction toward the first side surface 122A surrounded by the third insulation member 123 having the height H6 higher than the height H4 of the second connection pads 122. Therefore, the outermost connection members 130E may be further extended, in the horizontal direction, in the direction toward the second side surface 122B of a right portion contacting the fourth insulation member 123E rather than in the direction toward the first side surface 122A.

Figure 31:
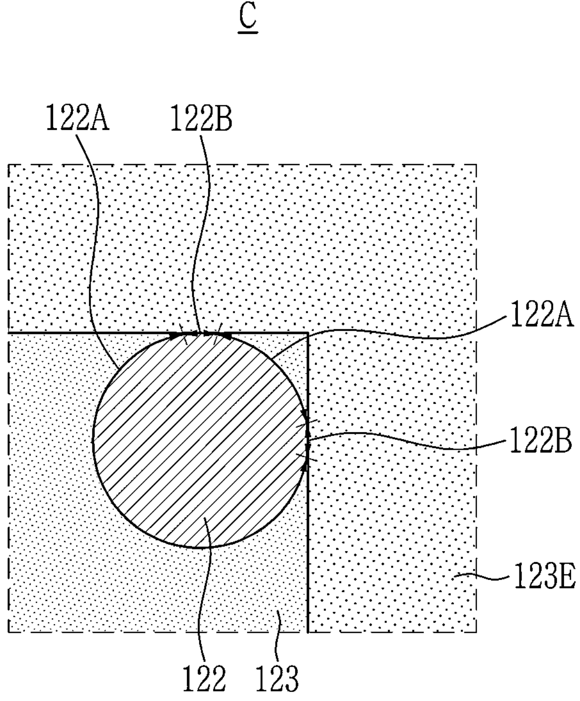
FIG. 31 is an enlarged top plan view of region C of FIG. 29.

FIG. 31 is an enlarged top plan view of region C of FIG. 29.

Referring to FIG. 31, the outermost second connection pad 122 among the second connection pads 122 may include the first side surface 122A contacting the side surface of the third insulation member 123 and the second side surface 122B contacting the side surface of the fourth insulation member 123E. Most of the side surface of the outermost second connection pad 122 may correspond to the first side surface 122A, and the right portion and upper portion among the side surface of the outermost second connection pad 122 contacting the fourth insulation member 123E may correspond to the second side surface 122B.

The solder paste during the reflow process may flow in a direction toward the second side surface 122B surrounded by the fourth insulation member 123E having the height H5 lower than the height H4 of the second connection pads 122 rather than in a direction toward the first side surface 122A surrounded by the third insulation member 123 having the height H6 higher than the height H4 of the second connection pads 122. Therefore, the outermost connection members 130E may be further extended, in the horizontal direction, in the direction toward the second side surface 122B of an upper portion and a right portion contacting the fourth insulation member 123E rather than in the direction toward the first side surface 122A.

Figure 32:
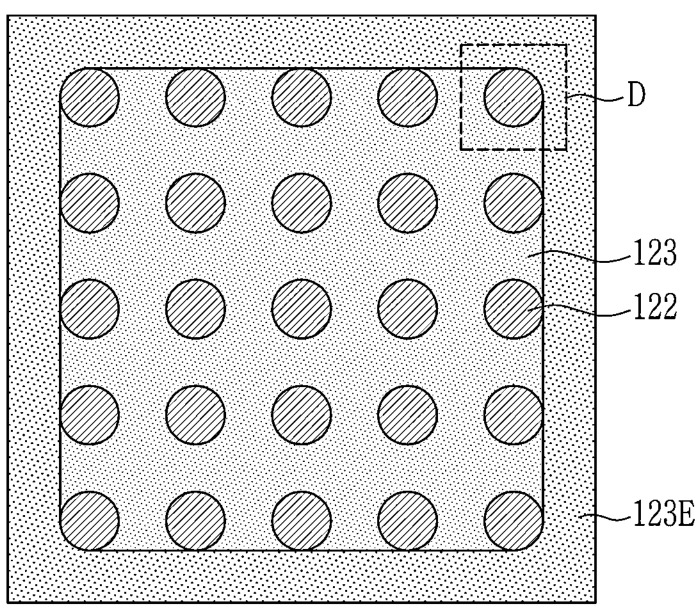
FIG. 32 is a top plan view showing a bottom surface of a semiconductor die according to an embodiment.

FIG. 32 is a plan view showing the bottom surface of the semiconductor die 120 according to an embodiment.

Referring to FIG. 32, the semiconductor die 120 may include the third insulation member 123 surrounding a portion of each side surface of the outermost second connection pads 122 and remaining second connection pads 122, and the fourth insulation member 123E surrounding a portion of each side surface of the outermost second connection pads 122 and the third insulation member 123. The outermost second connection pads 122 may include a side surface defined by the side surface of the third insulation member 123 and the side surface of the fourth insulation member 123E. The third insulation member 123 may surround at least a portion in the circumferential direction of the side surface of each of the second connection pads 122. The fourth insulation member 123E may surround a portion in the circumferential direction of the side surface of each of the second connection pads 122 and the third insulation member 123 in the circumferential direction.

Figure 33:
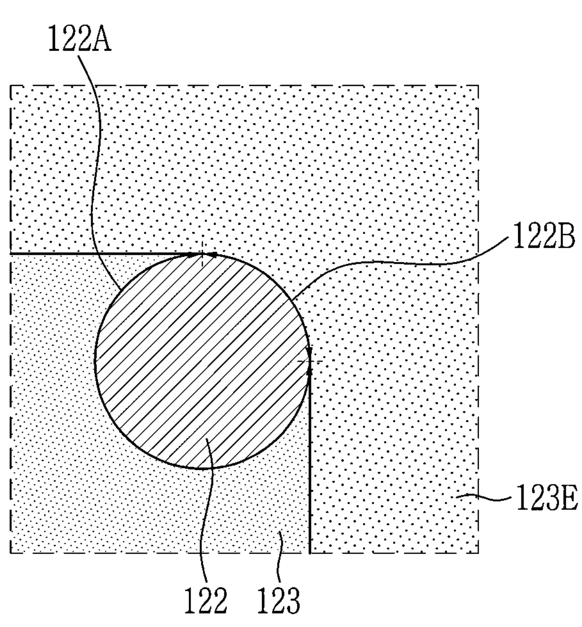
FIG. 33 is an enlarged top plan view of region D of FIG. 32.

FIG. 33 is an enlarged plan view of region D of FIG. 32.

Referring to FIG. 33, the outermost second connection pad 122 among the second connection pads 122 may include the first side surface 122A contacting the side surface of the third insulation member 123 and the second side surface 122B contacting the side surface of the fourth insulation member 123E. Most of the side surface of the outermost second connection pad 122 may correspond to the first side surface 122A, and a corner portion among the side surface of the outermost second connection pad 122 contacting the fourth insulation member 123E may correspond to the second side surface 122B. In an embodiment, a length of the second side surface 122B may be about ¼ or less of an entire length of the side surface of the outermost second connection pad 122 positioned at the corner.

The solder paste during the reflow process may flow in a direction toward the second side surface 122B surrounded by the fourth insulation member 123E having the height H5 lower than the height H4 of the second connection pads 122 rather than in a direction toward the first side surface 122A surrounded by the third insulation member 123 having the height H6 higher than the height H4 of the second connection pads 122. Therefore, the outermost connection members 130E may be further extended, in the horizontal direction, in the direction toward the second side surface 122B of a corner portion contacting the fourth insulation member 123E rather than in the direction toward the first side surface 122A.

Figure 34:
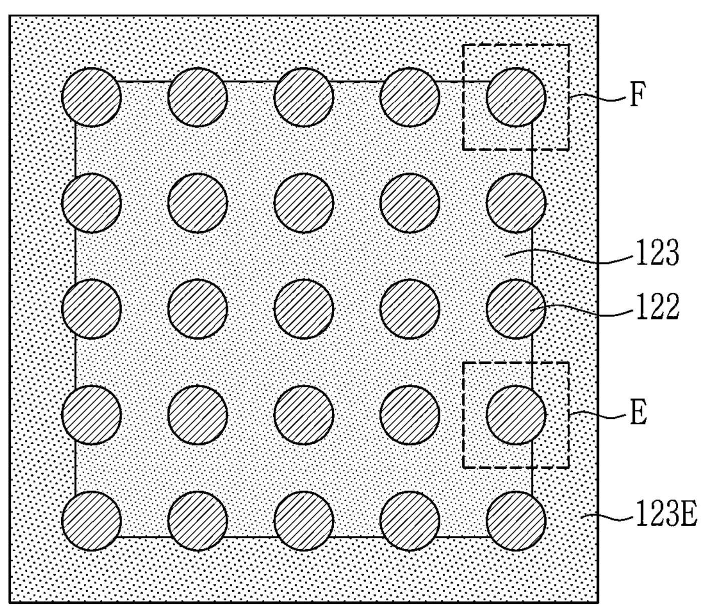
FIG. 34 is a top plan view showing a bottom surface of a semiconductor die according to an embodiment.

FIG. 34 is a plan view showing the bottom surface of the semiconductor die 120 according to an embodiment.

Referring to FIG. 34, the semiconductor die 120 may include the third insulation member 123 configured to surround a portion of each side surface of the outermost second connection pads 122 and remaining second connection pads 122, and the fourth insulation member 123E configured to surround a portion of each side surface of the outermost second connection pads 122 and the third insulation member 123. The outermost second connection pads 122 may include a side surface defined by the side surface of the third insulation member 123 and the side surface of the fourth insulation member 123E. The third insulation member 123 may surround at least a portion in the circumferential direction of the side surface of each of the second connection pads 122. The fourth insulation member 123E may surround a portion in the circumferential direction of the side surface of each of the second connection pads 122, and surround the third insulation member 123.

Figure 35:
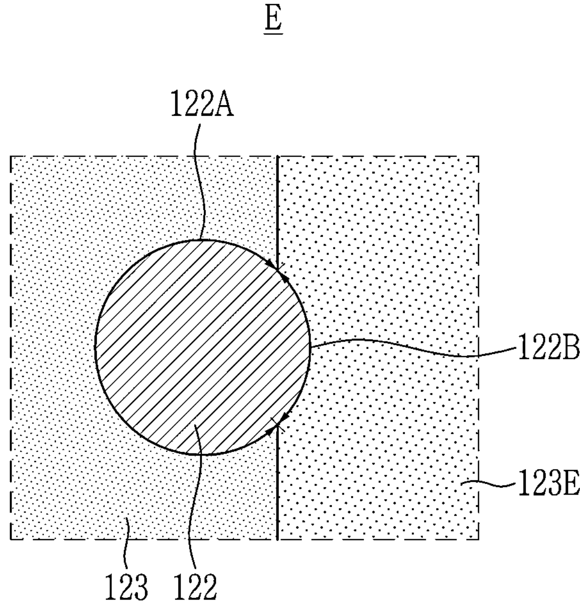
FIG. 35 is an enlarged top plan view of region E of FIG. 34.

FIG. 35 is an enlarged top plan view of region E of FIG. 34.

Referring to FIG. 35, the outermost second connection pad 122 among the second connection pads 122 may include the first side surface 122A contacting the side surface of the third insulation member 123 and the second side surface 122B contacting the side surface of the fourth insulation member 123E. Most of the side surface of the outermost second connection pad 122 may correspond to the first side surface 122A, and the right portion among the side surface of the outermost second connection pad 122 contacting the fourth insulation member 123E may correspond to the second side surface 122B. The length of the second side surface 122B in FIG. 35 may be greater than the length of the second side surface 122B in FIG. 30. In an embodiment, the length of the second side surface 122B may be about ½ or less of the entire length of the side surface of the outermost second connection pad 122 positioned at the corner.

The solder paste during the reflow process may flow in a direction toward the second side surface 122B surrounded by the fourth insulation member 123E having the height H5 lower than the height H4 of the second connection pads 122 rather than in a direction toward the first side surface 122A surrounded by the third insulation member 123 having the height H6 higher than the height H4 of the second connection pads 122. Therefore, the outermost connection members 130E may be further extended, in the horizontal direction, in the direction toward the second side surface 122B of a right portion contacting the fourth insulation member 123E rather than in the direction toward the first side surface 122A.

Figure 36:
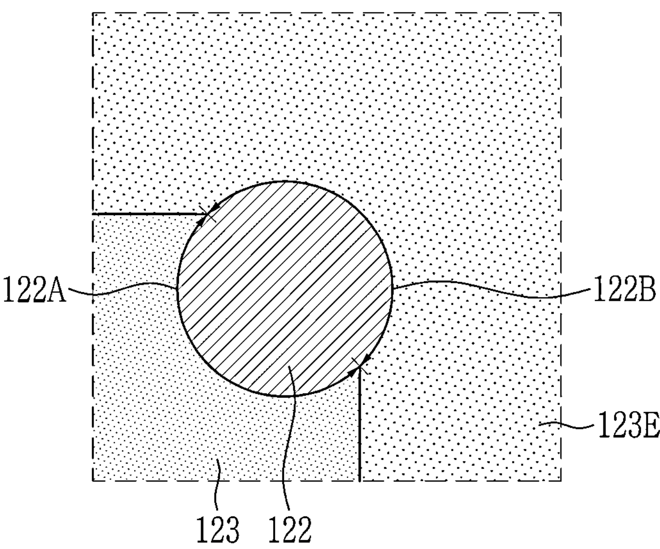
FIG. 36 is an enlarged top plan view of region F of FIG. 34.

FIG. 36 is an enlarged top plan view of region F of FIG. 34.

Referring to FIG. 36, the outermost second connection pad 122 among the second connection pads 122 may include the first side surface 122A contacting the side surface of the third insulation member 123 and the second side surface 122B contacting the side surface of the fourth insulation member 123E. Most of the side surface of the outermost second connection pad 122 may defined as the first side surface 122A, and the corner portion among the side surface of the outermost second connection pad 122 contacting the fourth insulation member 123E may be defined as the second side surface 122B. The length of the second side surface 122B in FIG. 36 may be greater than the length of the second side surface 122B in FIG. 33. In an embodiment, the length of the second side surface 122B may be about ¼ to about ¾ of the entire length of the side surface of the second connection pad 122. The length of the second side surface 122B of the second connection pad 122 may be set such that the solder pastes flowing during the reflow process does not contact each other.

The solder paste during the reflow process may flow in a direction toward the second side surface 122B surrounded by the fourth insulation member 123E having the height H5 lower than the height H4 of the second connection pads 122 rather than in a direction toward the first side surface 122A surrounded by the third insulation member 123 having the height H6 higher than the height H4 of the second connection pads 122. Therefore, the outermost connection members 130E may be further extended, in the horizontal direction, in the direction toward the second side surface 122PB of a corner portion contacting the fourth insulation member 123E rather than in the direction toward the first side surface 122A.

Figure 37:
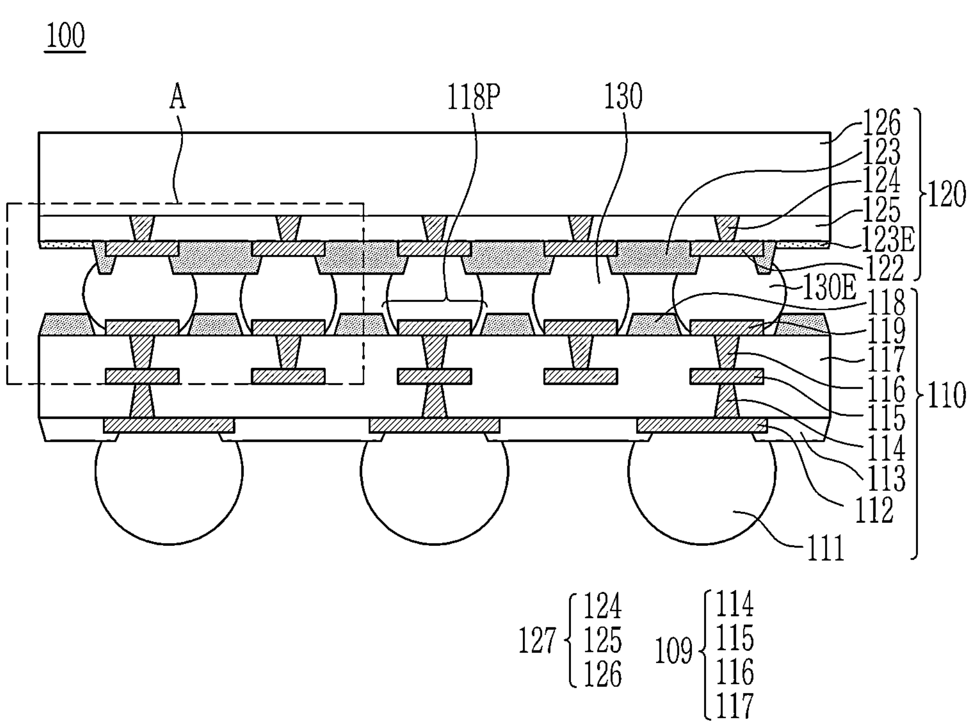
FIG. 37 is a cross-sectional view showing a semiconductor package of still another embodiment.

FIG. 37 is a cross-sectional view showing a semiconductor package of another embodiment. In FIG. 37, the semiconductor die 120 may include the second connection pads 122, the third insulation member 123 having the height higher than a height of the second connection pads 122, and the fourth insulation member 123E having a height lower than the height of the second connection pads 122.

Referring to FIG. 37, the semiconductor package 100 may include the printed circuit board 110, the semiconductor die 120 and the connection members 130. In an embodiment, the semiconductor package 100 may include fine-pitch ball grid array (FBGA) package. The contents of a printed circuit board 100 and the connection members 130 described in connection with FIG. 27 may be equally applied to the printed circuit board 100 and the connection members 130 of FIG. 37.

The semiconductor die 120 may include the second connection pads 122, the third insulation member 123, the fourth insulation member 123E and the second die base 127. The second die base 127 may include the third via 124, the second insulation layer 125, and the third insulation layer 126. In the present disclosure, for mere convenience, with respect to the second die base 127, the third via 124, the second insulation layer 125, and the third insulation layer 126 which are an uppermost configuration of back end of line (BEOL) of the semiconductor die 120 for electrical connection to the printed circuit board 110, are shown, but other components in the third insulation layer 126 are omitted.

The second connection pads 122 may be disposed between a third vias 124 and the connection members 130. The second connection pad 122 may electrically connect the third via 124 to the connection member 130.

The third insulation member 123 may be disposed below the second insulation layer 125. The third insulation member 123 may surround all in the circumferential direction of the side surface of each of the second connection pads 122. The third insulation member 123 may have a height higher than the height of the second connection pads 122. The third insulation member 123 may surround an edge of one surface (bottom surface) of the second connection pads 122. The one surface of the second connection pads 122 may be a surface facing the printed circuit board 110. The third insulation member 123 may limit and/or prevent the connection members 130 from being short-circuited.

The fourth insulation member 123E may be disposed below the second insulation layer 125. The fourth insulation member 123E may surround the third insulation member 123. The fourth insulation member 123E may be disposed to be spaced apart from the second connection pad 122. The fourth insulation member 123E may have a height lower than height of the second connection pads 122. The fourth insulation member 123E limits and/or prevents the solder paste before curing to the connection members 130 from leaking out of printed circuit board (110, the semiconductor die 120).

Except for the contents with respect to the second connection pads 122, the third insulation member 123, and the fourth insulation member 123E described above, the contents described in FIG. 27 may be equally applied to FIG. 37.

Figure 38:
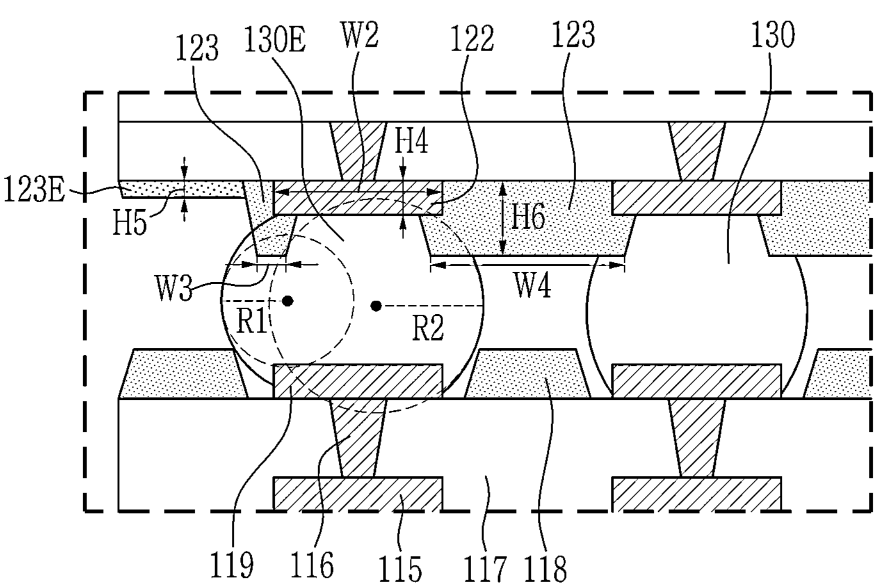
FIG. 38 is an enlarged cross-sectional view of region A of FIG. 37.

FIG. 38 is an enlarged cross-sectional view of region A of FIG. 37.

Referring to FIG. 38, the region A comprises the outermost connection member 130E among the connection members 130 electrically connect the printed circuit board 110 and the semiconductor die 120, and the connection member 130 next to the outermost connection member 130E.

The connection member 130 may be disposed to contact the bottom surface of the second connection pad 122. The connection member 130 may be electrically connected to the second connection pad 122.

The second connection pad 122 may be surrounded by the third insulation member 123. All of the side surface of the second connection pad 122 may be cover by the third insulation member 123. The side surface of the second connection pad 122 may contact the third insulation member 123. An edge of one surface (bottom surface) of the second connection pad 122 may be cover by the third insulation member 123. The edge of the one surface (bottom surface) of the second connection pad 122 may contact the third insulation member 123. A portion of one surface (lower surface) of the second connection pad 122, except for the edge, may be exposed from the third insulation member 123 to contact the connection member 130.

When warpage occurs to the semiconductor package 100 to cause the solder pastes to collapse before curing to the connection members 130 during the reflow process in which the connection members 130 and the first connection pads 119 of the printed circuit board 110 are bonded, the solder pastes are circularly extended along the circular shape of the plurality of through openings 118P (refer to FIG. 27), and at this time, when the circularly extended solder pastes are cured in contact with each other, a short circuit may occur between the connection members 130.

In order to limit and/or prevent this, the insulation member surrounding the outermost second connection pads 122 may include the third insulation member 123 and the fourth insulation member 123E.

The third insulation member 123 may surround all in the circumferential direction of the side surface of each of the outermost second connection pads 122. The third insulation member 123 may surround all edges of one surface (bottom surface) of the outermost second connection pads 122.

The fourth insulation member 123E may surround the third insulation member 123. Height of the third insulation member 123 may be formed to be higher than the height of the second connection pad 122, and height of the fourth insulation member 123E may be formed to be lower than a height of the second connection pad 122.

In an embodiment, the height H6 of the third insulation member 123 may be about two times to about three times of the height H4 of the second connection pads 122. In an embodiment, the height H5 of the fourth insulation member 123E may be about ½ to about ¼ times the height H4 of the second connection pads 122. In an embodiment, the second connection pads 122 may have the height H4 of about 10 μm to about 25 μm. In an embodiment, the second connection pads 122 may have the width W2 of about 200 μm to about 300 μm.

In an embodiment, the third insulation member 123 may have the height H6 of about 20 μm to about 75 μm. When the height H6 of the third insulation member 123 is less than 20 μm, a short circuit may occur between the first connection members 130. In addition, when the height H6 of the third insulation member 123 is greater than 75 μm, contact between the third insulation member 123 and the first insulation member 118 of the printed circuit board 110 may occur, and a contact failure (non-contact) the connection member 130 may occur between the first connection pad 119 and the second connection pad 122.

In an embodiment, the fourth insulation member 123E may have the height H5 of 2.5 μm to 12.5 μm. When the height H5 of the fourth insulation member 123E is less than 2.5 μm, the solder paste may flow in an exterior direction of the printed circuit board 110 during the reflow process. When the height H5 of the fourth insulation member 123E exceeds 12.5 μm, a short circuit may occur between the outermost connection members 130E and the connection members 130.

In an embodiment, an interval W3 in the horizontal direction between the fourth insulation member 123E and the outermost second connection pad 122 of the third insulation member 123 may be smaller than an interval W4 in the horizontal direction between the second connection pads 122 of the third insulation member 123.

Since the interval W3 in the horizontal direction of the third insulation member 123 positioned between the outermost second connection pad 122 and the fourth insulation member 123E is smaller than the interval W4 in the horizontal direction of the third insulation member 123 positioned between the second connection pads 122 of the third insulation member 123, and the height H5 of the fourth insulation member 123E is lower than the height H6 of the third insulation member 123, the solder paste during the reflow process may flow in a direction where the fourth insulation member 123E is closely positioned. Therefore, the outermost connection members 130E may further extend in the direction where the fourth insulation member 123E is closely positioned in the horizontal direction. In addition, a curvature 1/R1 of the second side surface of the outermost connection members 130E may be larger than a curvature 1/R2 of the first side surface.

Figure 39:
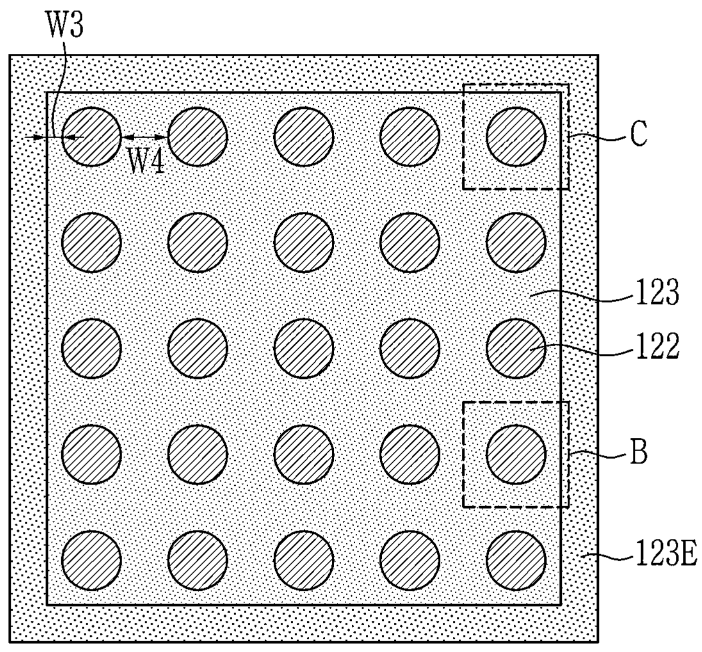
FIG. 39 is a top plan view showing a bottom surface of a semiconductor die according to an embodiment.

FIG. 39 is a plan view showing the bottom surface of the semiconductor die 120 according to an embodiment.

Referring to FIG. 39, the semiconductor die 120 may include the third insulation member 123 surrounding the second connection pads 122, and the fourth insulation member 123E surrounding the third insulation member 123. The second connection pads 122 may include a side surface defined by the side surface of the third insulation member 123. The third insulation member 123 may surround all in the circumferential direction of the side surface of each of the second connection pads 122. The fourth insulation member 123E may surround the third insulation member 123.

Figure 40:
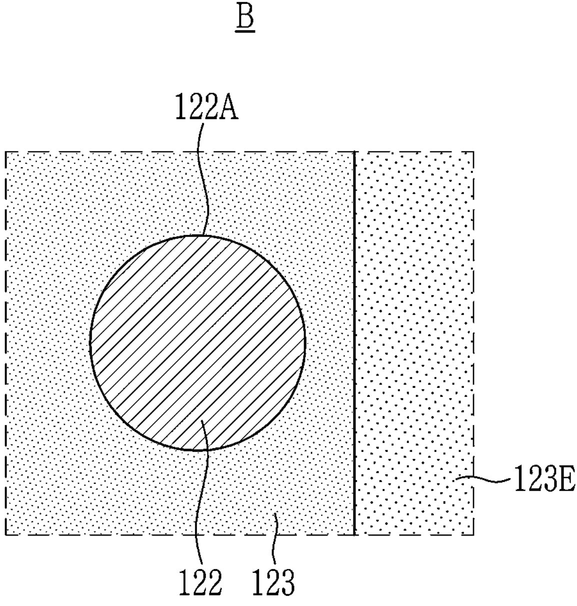
FIG. 40 is an enlarged top plan view of region B of FIG. 39.

FIG. 40 is an enlarged top plan view of region B of FIG. 39.

Referring to FIG. 40, the outermost second connection pad 122 among the second connection pads 122 may include the side surface 122A surrounded by the third insulation member 123. The solder paste during the reflow process may flow in a rightward direction where the fourth insulation member 123E is closely positioned. Therefore, the outermost connection members 130E may further extend in the direction where the fourth insulation member 123E is closely positioned in the horizontal direction.

Figure 41:
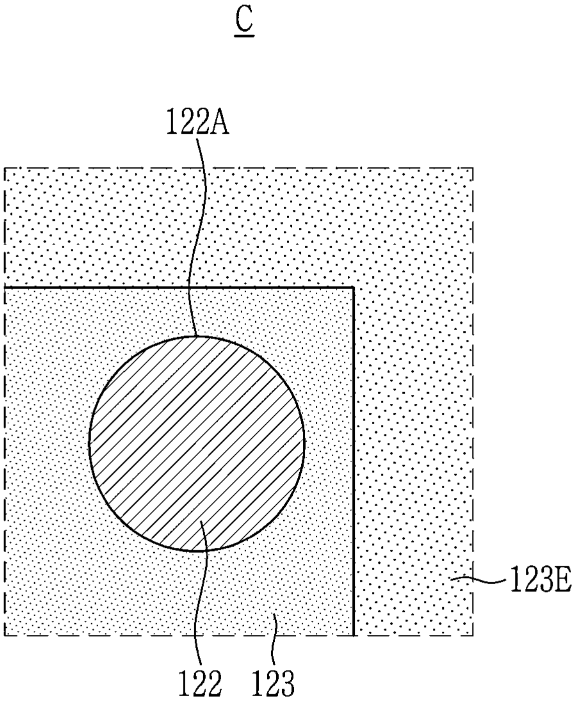
FIG. 41 is an enlarged top plan view of region C of FIG. 39.

FIG. 41 is an enlarged top plan view of region C of FIG. 39.

Referring to FIG. 41, the outermost second connection pad 122 among the second connection pads 122 may include the side surface 122A surrounded by the third insulation member 123. The solder paste during the reflow process may flow in a rightward direction and upward direction where the fourth insulation member 123E is closely positioned. Therefore, the outermost connection members 130E may further extend in the direction where the fourth insulation member 123E is closely positioned in the horizontal direction.

FIG. 42 to FIG. 62 are cross-sectional views showing operations of a method for manufacturing the semiconductor die 120 according to an embodiment. FIG. 42 to FIG. 58 may be applied to a method for manufacturing the semiconductor die 120 used in a semiconductor package according to an embodiment of FIG. 27. FIG. 42 to FIG. 54, and FIG. 59 to FIG. 62 may be applied to a method for manufacturing the semiconductor die 120 used in a semiconductor package according to an embodiment of FIG. 37.

Figure 42:
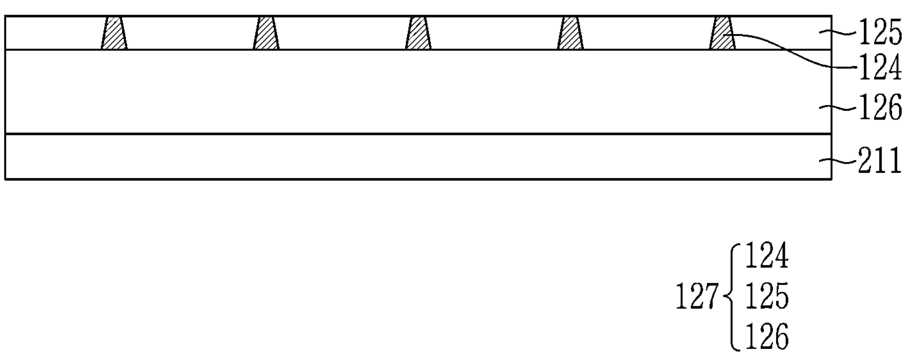
FIG. 42 to FIG. 62 are cross-sectional views showing operations of a method for manufacturing a semiconductor die according to an embodiment.

FIG. 42 is a cross-sectional view showing attaching the second die base 127 including the third via 124, the second insulation layer 125, and the third insulation layer on a carrier 211.

Referring to FIG. 42, the second die base 127 formed with the third via 124 and the second insulation layer 125 may be attached on the carrier 211. The carrier 210 may include, for example, a silicon-based material such as glass or silicon oxide, an organic material, or another material such as aluminum oxide, any combination of these materials, and the like.

Figure 43:
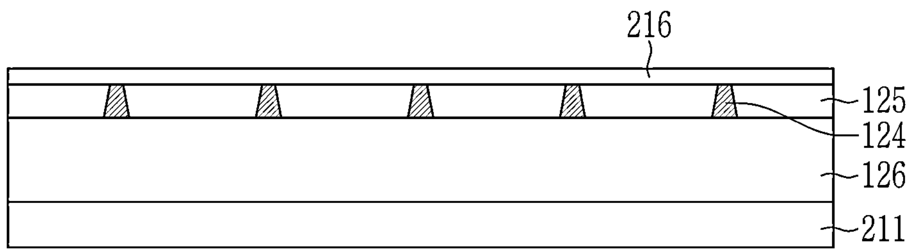

FIG. 43 is a cross-sectional view showing forming a fourth photoresist 216 on the third via 124 and the second insulation layer 125.

Referring to FIG. 43, the fourth photoresist 216 may be formed on the third via 124 and the second insulation layer 125 of the semiconductor die 120. In an embodiment, the fourth photoresist 216 may be formed by a sputtering process, a physical vapor deposition (PVD) process, an atomic layer deposition (ALD) process, or a chemical vapor deposition (CVD) process, and the like. In another embodiment, the fourth photoresist 216 may be formed by spin coating. In an embodiment, the fourth photoresist 216 may include an organic polymer resin including a photoactive material.

Figure 44:
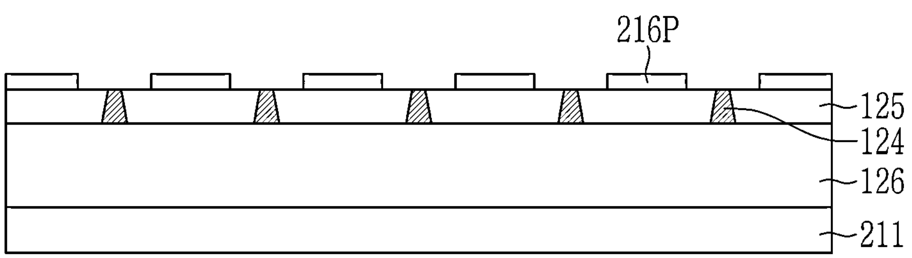

FIG. 44 is a cross-sectional view showing forming a fourth photoresist pattern 216P by exposing and developing the fourth photoresist 216.

Referring to FIG. 44, the fourth photoresist pattern 216P may be formed by exposing and developing the fourth photoresist 216.

Figure 45:
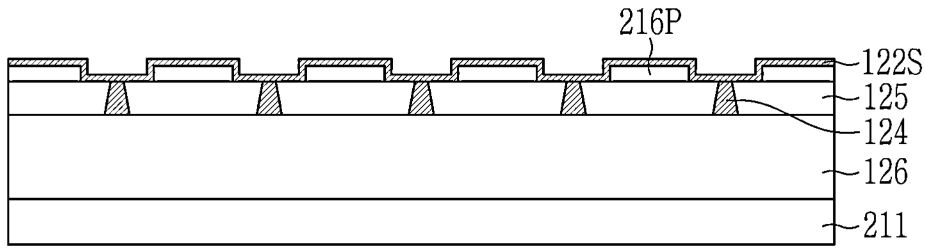

FIG. 45 is a cross-sectional view showing forming a seed metal layer 122S on the exposed second insulation layer 125, the exposed third vias 124, and second photoresist pattern 216P.

Referring to FIG. 45, the seed metal layer 122S may be formed on the exposed third vias 124, the exposed second insulation layer 125, and the fourth photoresist pattern 216P. In an embodiment, the seed metal layer 122S may include copper. In an embodiment, the seed metal layer 122S may be formed by electroless plating. In an embodiment, a cleaning process or a metal catalyst activation pretreatment process may be performed prior to electroless plating. In an embodiment, the seed metal layer 122S may be formed by sputtering.

Figure 46:
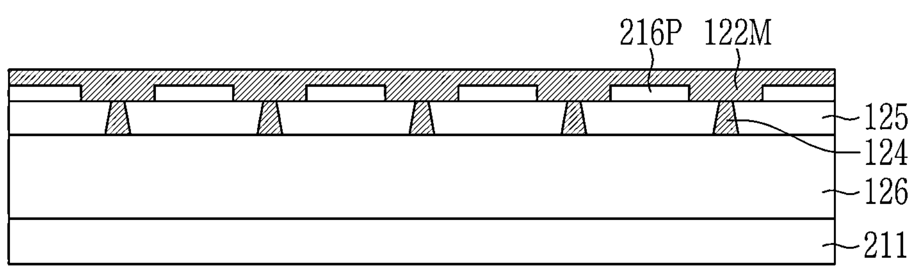

FIG. 46 is a cross-sectional view showing forming a metal layer 122M on the seed metal layer 122S.

Referring to FIG. 46, the metal layer 122M may be formed on the seed metal layer 122S. In an embodiment, the metal layer 122M may include copper. In an embodiment, the metal layer 122M may be formed by electrolytic plating. The metal layer 122M may be formed by growing a metal layer by electrolytic plating from the previously formed seed metal layer 122S. In an embodiment, an annealing process may be performed after forming the metal layer 122M.

Figure 47:
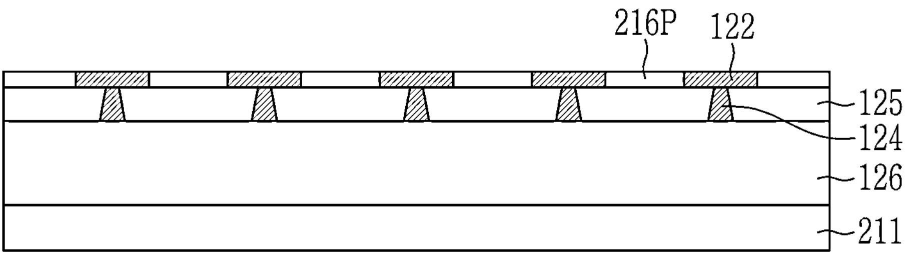

FIG. 47 is a cross-sectional view showing forming the second connection pads 122 by planarizing an upper surface of the metal layer 122M.

Referring to FIG. 47, the upper surface of the metal layer 122M may be planarized by applying a chemical mechanical planarization (CMP) process or a mechanical grinding process, and the second connection pads 122 may be formed.

Figure 48:
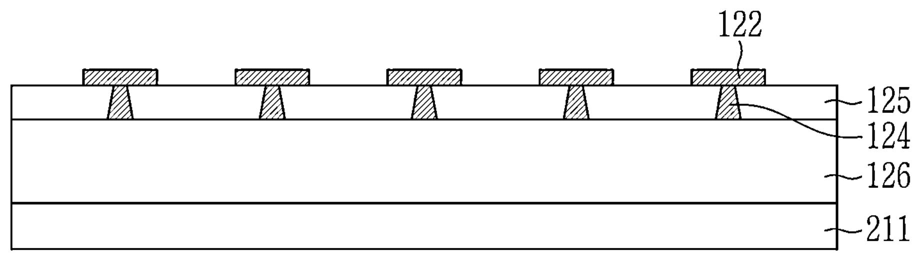

FIG. 48 is a cross-sectional view showing removing the fourth photoresist pattern 216P.

Referring to FIG. 48, the fourth photoresist pattern 216P between the second connection pads 122 may be removed. In an embodiment, the fourth photoresist pattern 216P may be removed by at least one of etching, ashing, and stripping.

Figure 49:
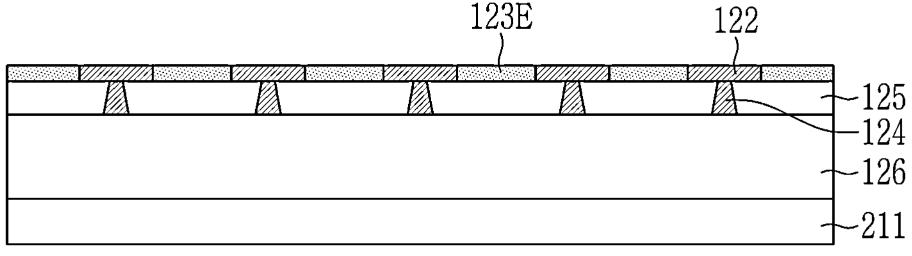

FIG. 49 is a cross-sectional view showing forming a third solder resist 123E on the exposed second insulation layer 125.

Referring to FIG. 49, the third solder resist 123E may be applied on the exposed second insulation layer 125.

Figure 50:
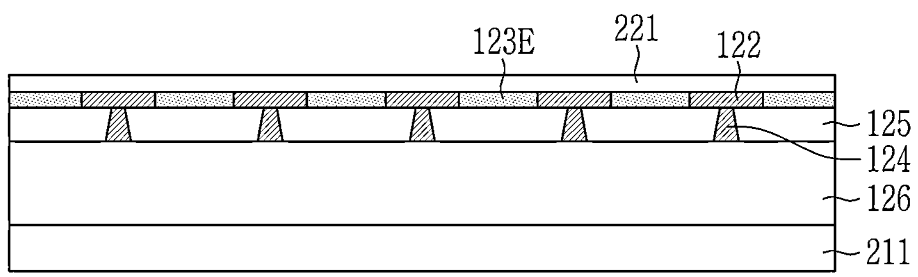

FIG. 50 is a cross-sectional view showing forming a fifth photoresist 221 on the second connection pads 122 and the third solder resist 123E.

Referring to FIG. 50, the fifth photoresist 221 may be formed on the second connection pads 122 and the third solder resist 123E. In an embodiment, the fifth photoresist 221 may be formed by a sputtering process, a physical vapor deposition (PVD) process, an atomic layer deposition (ALD) process, or a chemical vapor deposition (CVD) process, and the like. In another embodiment, the fifth photoresist 221 may be formed by spin coating. In an embodiment, the fifth photoresist 221 may include an organic polymer resin including a photoactive material.

Figure 51:
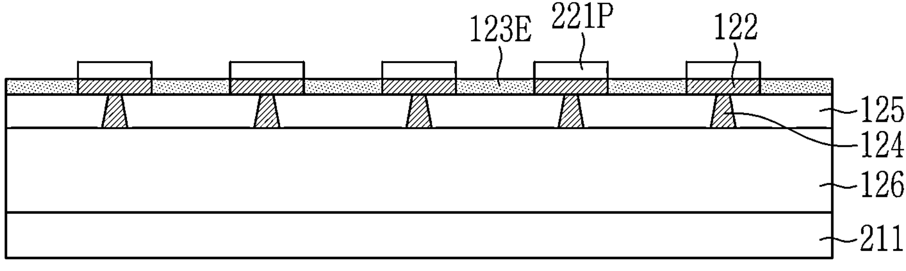

FIG. 51 is a cross-sectional view showing forming a fifth photoresist pattern 221P by exposing and developing the fifth photoresist 221.

Referring to FIG. 51 a fifth photoresist pattern 221P is formed by exposing and developing the fifth photoresist 221.

Figure 52:
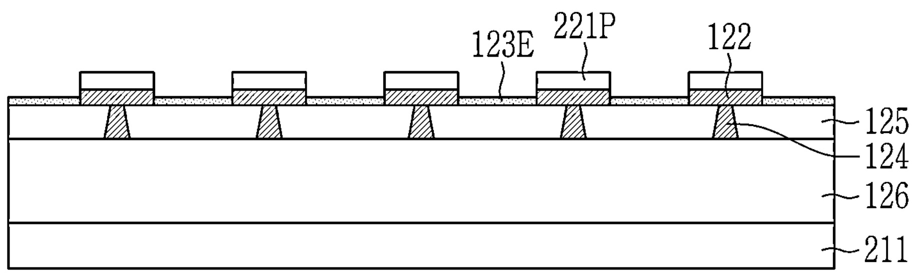

FIG. 52 is a cross-sectional view showing removing a portion of the exposed third solder resist 123E by using the fifth photoresist pattern 221P as a mask.

Referring to FIG. 52, a portion of the exposed third solder resist 123E by using a fourth photoresist pattern 221P as a mask may be etched.

Figure 53:
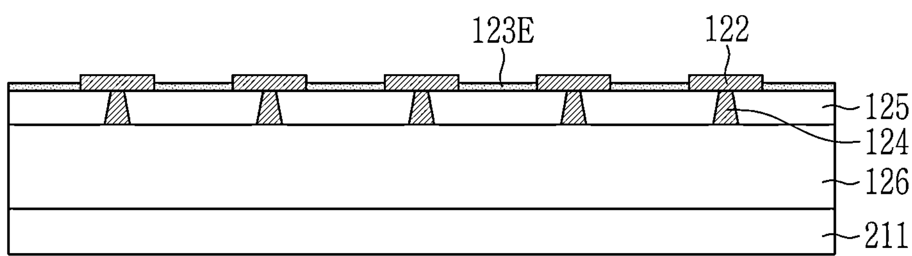

FIG. 53 is a cross-sectional view showing removing the fourth photoresist pattern 221P.

Referring to FIG. 53, the fourth photoresist pattern 221P may be removed. In an embodiment, the fourth photoresist pattern 221P may be removed by at least one of etching, ashing, and stripping.

Figure 54:
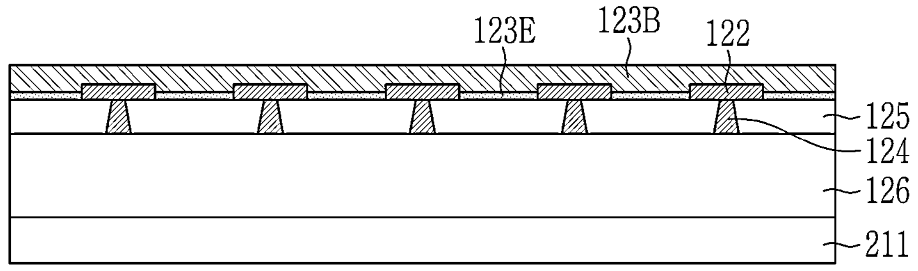

FIG. 54 is a cross-sectional view showing forming a fourth solder resist 123B on the third solder resist 123E and the second connection pads 122.

Referring to FIG. 54, the fourth solder resist 123B may be applied on the third solder resist 123E and the second connection pads 122.

Figure 55:
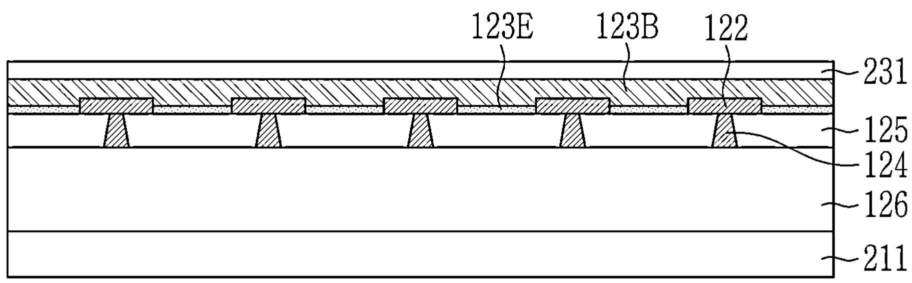

FIG. 55 is a cross-sectional view showing forming a sixth photoresist 231 on the fourth solder resist 123B.

Referring to FIG. 55, the sixth photoresist 231 may be formed on the fourth solder resist 123B. In an embodiment, the sixth photoresist 231 may be formed by a sputtering process, a physical vapor deposition (PVD) process, an atomic layer deposition (ALD) process, or a chemical vapor deposition (CVD) process, and the like. In an embodiment, the sixth photoresist 231 may be formed by spin coating. In an embodiment, the sixth photoresist 231 may include an organic polymer resin including a photoactive material.

Figure 56:
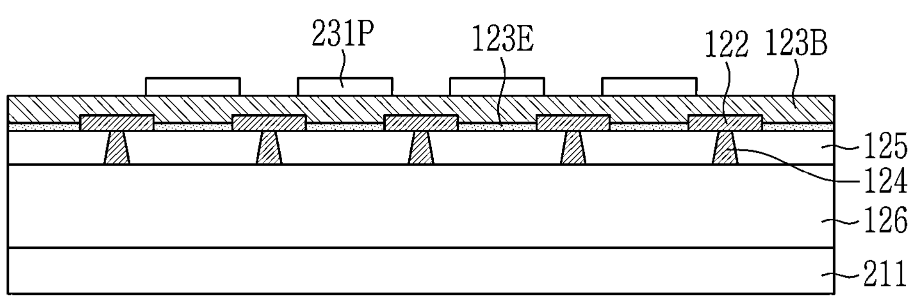

FIG. 56 is a cross-sectional view showing forming a sixth photoresist pattern 231P by exposing and developing the sixth photoresist 231.

Referring to FIG. 56, the sixth photoresist pattern 231P may be formed by exposing and developing the sixth photoresist 231.

Figure 57:
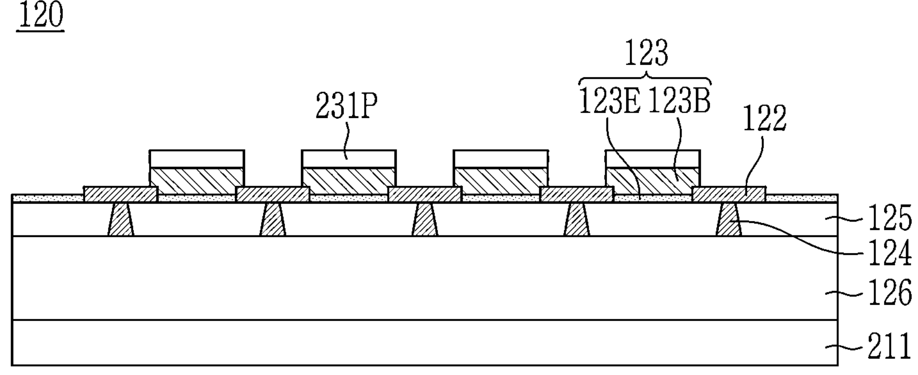

FIG. 57 is a cross-sectional view showing removing the exposed fourth solder resist 123B by using the sixth photoresist pattern 231P as a mask.

Referring to FIG. 57, the exposed fourth solder resist 123B may be etched using the sixth photoresist pattern 231P as a mask.

Figure 58:
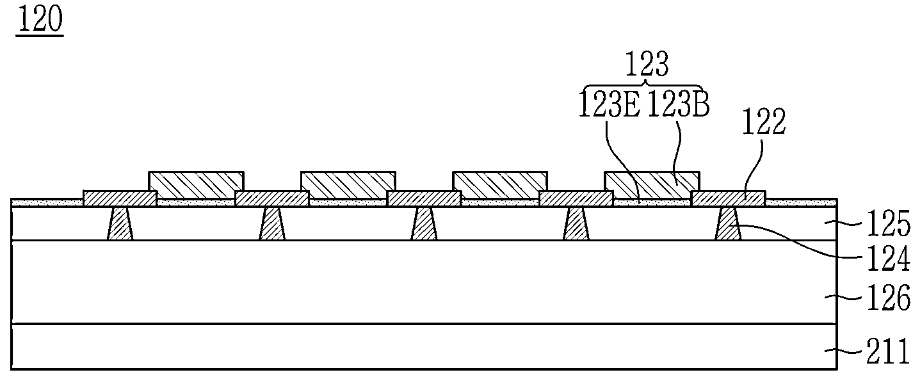

FIG. 58 is a cross-sectional view showing removing the sixth photoresist pattern 231P.

Referring to FIG. 58, the sixth photoresist pattern 231P may be removed. In an embodiment, the sixth photoresist pattern 231P may be removed by at least one of etching, ashing, and stripping. The fourth solder resist 123B and the third solder resist 123E that are not removed may become the third insulation member 123 after being hardened. The third solder resist 123E exposed by removing the fourth solder resist 123B may become a fourth connection member 123E after being hardened. The third insulation member 123 may surround a portion in the circumferential direction of the side surface of each of the outermost second connection pads 122 and all in the circumferential direction of the side surface of each of the remaining second connection pads 122. The fourth insulation member 123E may surround a portion in the circumferential direction of the side surface of each of the outermost second connection pads 122.

Figure 59:
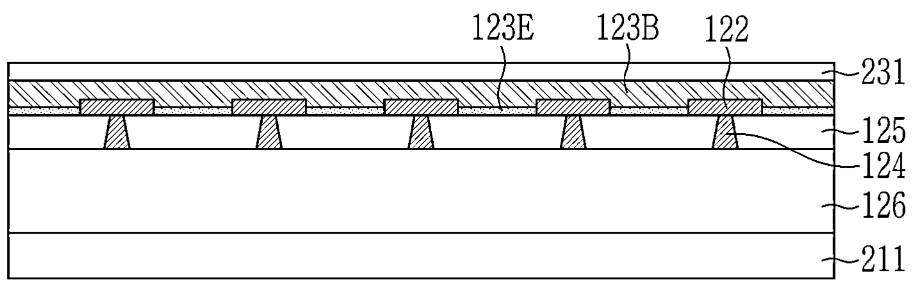

FIG. 59 is a cross-sectional view showing forming the sixth photoresist 231 on the fourth solder resist 123B. Subsequently to FIG. 54, FIG. 59 to FIG. 62 are cross-sectional views of a method for manufacturing the semiconductor die 120 used in a semiconductor package according to an embodiment of FIG. 37.

Referring to FIG. 59, the sixth photoresist 231 may be formed on the fourth solder resist 123B. In an embodiment, the sixth photoresist 231 may be formed by a sputtering process, a physical vapor deposition (PVD) process, an atomic layer deposition (ALD) process, or a chemical vapor deposition (CVD) process, and the like. In an embodiment, the sixth photoresist 231 may be formed by spin coating. In an embodiment, the sixth photoresist 231 may include an organic polymer resin including a photoactive material.

Figure 60:
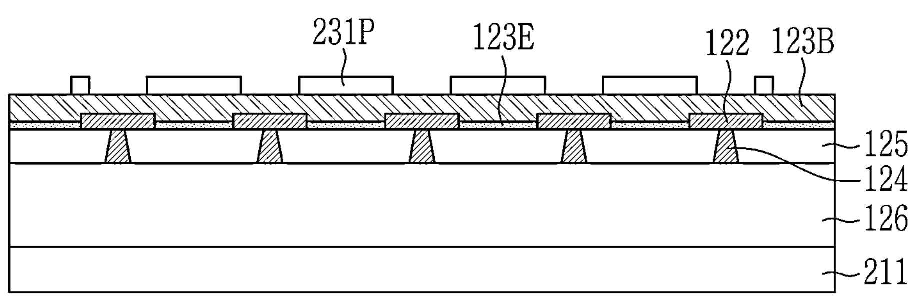

FIG. 60 is a cross-sectional view showing forming the sixth photoresist pattern 231P by exposing and developing the sixth photoresist 231.

Referring to FIG. 60, the sixth photoresist pattern 231P may be formed by exposing and developing the sixth photoresist 231.

Figure 61:
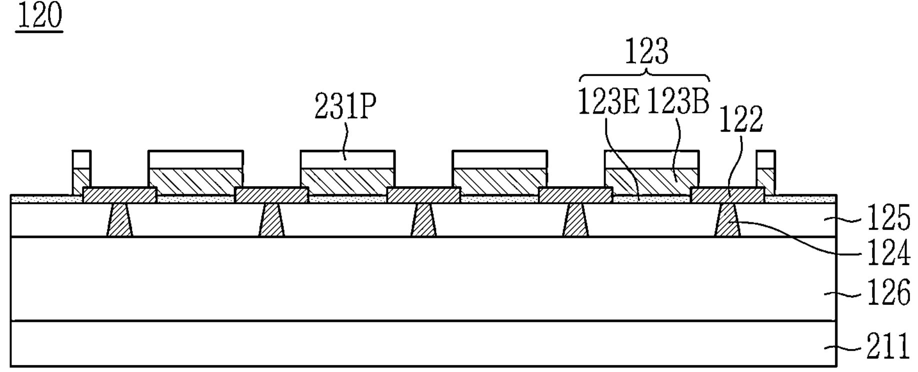

FIG. 61 is a cross-sectional view showing removing the fourth solder resist 123B exposed by using the sixth photoresist pattern 231P as a mask.

Referring to FIG. 61, the exposed fourth solder resist 123B may be etched using the sixth photoresist pattern 231P as a mask.

Figure 62:
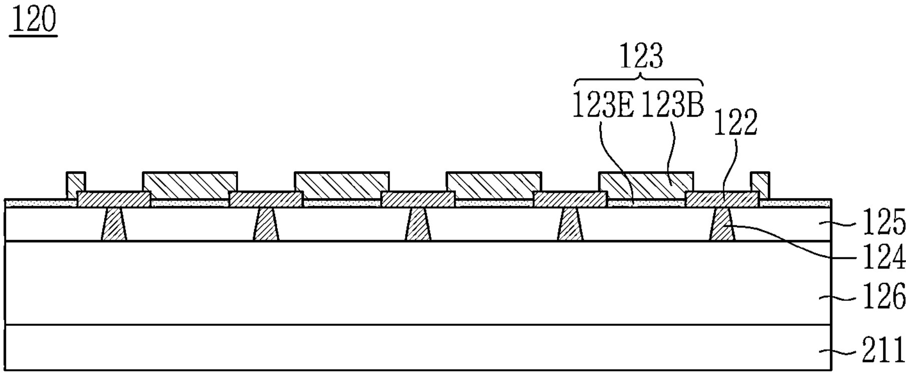

FIG. 62 is a cross-sectional view showing removing the sixth photoresist pattern 231P.

Referring to FIG. 62, the sixth photoresist pattern 231P may be removed. In an embodiment, the sixth photoresist pattern 231P may be removed by at least one of etching, ashing, and stripping. The fourth solder resist 123B and the third solder resist 123E that are not removed may become a third insulation member 123 after being hardened. The third solder resist 123E exposed by removing the fourth solder resist 123B may become a fourth insulation member 123E after being hardened. The third insulation member 123 may surround all in the circumferential direction of the side surface of each of the second connection pads 122. The fourth insulation member 123E may surround the third insulation member 123.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor structure, comprising:

a plurality of vias;

an insulation layer surrounding side surfaces of the plurality of vias;

a plurality of connection pads on the plurality of vias, respectively;

a first insulation member on the insulation layer, the first insulation member including a plurality of through openings in which the plurality of connection pads respectively are disposed, such that each corresponding connection pad among the plurality of connection pads is on a corresponding via among the plurality of vias and in a corresponding through opening among the plurality of through openings, and a height of the first insulation member being higher than heights of the plurality of connection pads; and a second insulation member on the insulation layer and surrounding the first insulation member, wherein a height of the second insulation member is lower than the heights of the plurality of connection pads, and outermost through openings among the plurality of through openings include a first inner side surface defined by a side surface of the first insulation member and a second inner side surface defined by a side surface of the second insulation member.

2. The semiconductor structure of claim 1, wherein the height of the first insulation member is 2 times to 3 times the heights of the plurality of connection pads.

3. The semiconductor structure of claim 1, wherein the height of the second insulation member is ½ times to ¼ times a height of the plurality of connection pads.

4. The semiconductor structure of claim 1, wherein the plurality of through openings exposes an upper surface of the insulation layer.

5. The semiconductor structure of claim 1, wherein each of the plurality of connection pads is spaced apart from the first inner side surface and the second inner side surface.

6. The semiconductor structure of claim 1, wherein each connection pad has a height of 10 μm to 25 μm.

7. The semiconductor structure of claim 1, wherein the first insulation member has a height of 20 μm to 75 μm.

8. The semiconductor structure of claim 1, wherein the second insulation member has a height of 2.5 μm to 12.5 μm.

9. A semiconductor package, comprising:

a first structure including a plurality of first vias, a first insulation layer surrounding side surfaces of the plurality of first vias, a plurality of first connection pads on the plurality of first vias, a first insulation member on the first insulation layer, and a second insulation member on the first insulation layer and surrounding the first insulation layer, the first insulation member including a plurality of through openings in which the plurality of first connection pads are disposed, such that each corresponding first connection pad among the plurality of first connection pads is on a corresponding first via among the plurality of first vias and in a corresponding through opening among the plurality of through openings, a height of the first insulation member being higher than heights of the plurality of first connection pads, a height of the second insulation member being lower than the heights of the plurality of first connection pads, and outermost through openings among the plurality of through openings including a first inner side surface defined by a side surface of the first insulation member and a second inner side surface defined by a side surface of the second insulation member;

a second structure on the first structure, the second structure including a plurality of second connection pads, a third insulation member surrounding the plurality of second connection pads, a plurality of second vias on the plurality of second connection pads, and a second insulation layer surrounding the plurality of second vias, wherein each corresponding second via among the plurality of second vias is on a corresponding second connection pad among the plurality of second connection pads; and a plurality of connection members between the first structure and the second structure.

10. The semiconductor package of claim 9, wherein each corresponding connection member among the plurality of connection members is configured to electrically connect one of the plurality of second connection pads to one of the plurality of first connection pads.

11. The semiconductor package of claim 9, wherein outermost connection members among the plurality of connection members each comprise a first side surface adjacent to the first insulation member and a second side surface adjacent to the second insulation member.

12. The semiconductor package of claim 11, wherein a curvature of the second side surface is larger than a curvature of the first side surface.

13. The semiconductor package of claim 11, wherein the second side surface extends further in a horizontal direction than the first side surface.

14. The semiconductor package of claim 9, wherein each second connection pad among the plurality of second connection pads is in contact with the third insulation member.

15. The semiconductor package of claim 9, wherein the plurality of connection members comprise Sn, Ag, and Cu (SAC).

16. The semiconductor package of claim 9, wherein the semiconductor package comprises a fine-pitch ball grid array (FBGA) package.

17. The semiconductor package of claim 9, wherein the first structure comprises a printed circuit board (PCB).

18. A method for manufacturing a semiconductor structure, the method comprising:

forming a plurality of connection pads on a substrate base, the substrate base including a plurality of vias and an insulation layer surrounding side surfaces of the plurality of vias;

applying a first solder resist on the substrate base and the plurality of connection pads;

forming a plurality of first through openings in the first solder resist such that the plurality of connection pads are exposed;

applying a second solder resist in the plurality of first through openings and on the first solder resist; and removing the second solder resist of an edge region of the substrate base, such that the first solder resist of the edge region of the substrate base is exposed, while forming a plurality of second through openings in the second solder resist such that the plurality of connection pads are exposed, wherein a height of the first solder resist is lower than a height of the plurality of connection pads, and a sum of the height of the first solder resist and a height of the second solder resist is larger than heights of the plurality of connection pads.

19. The method of claim 18, wherein the plurality of second through openings are formed at same positions as the plurality of first through openings.

20. The method of claim 18, wherein the first solder resist includes a same material as the second solder resist.

* * * * *